US012707762B2

(12) United States Patent
Mi et al.

(10) Patent No.: US 12,707,762 B2
(45) Date of Patent: Aug. 11, 2026

(54) METHODS AND DEVICES FOR SOLID STATE NANOWIRE DEVICES

(71) Applicant: THE ROYAL INSTITUTION FOF THE ADVANCEMENT OF LEARNING / MCGILL UNIVERSITY, Montreal (CA)

(72) Inventors: Zetian Mi, Verdun (CA); Hieu Pham Trung Nguyen, Montreal (CA); Songrui Zhao, Montreal (CA)

(73) Assignee: The Royal Institution for the Advancement of Learning/McGill University, Montreal (CA)

( * ) Notice: Subject to any disclaimer, the term of this patent is extended or adjusted under 35 U.S.C. 154(b) by 49 days.

(21) Appl. No.: 17/956,571

(22) Filed: Sep. 29, 2022

(65) Prior Publication Data

US 2023/0121392 A1 Apr. 20, 2023

Related U.S. Application Data

(63) Continuation of application No. 14/776,120, filed as application No. PCT/CA2014/000234 on Mar. 14, 2014, now Pat. No. 11,502,219.

(Continued)

(51) Int. Cl.

*H01L 33/06* (2010.01)
*H10H 20/812* (2025.01)
*H10H 20/818* (2025.01)

(52) U.S. Cl.

CPC ........ *H10H 20/812* (2025.01); *H10H 20/818* (2025.01)

(58) Field of Classification Search

CPC .... H10H 20/812; H10H 20/818; H01L 33/06; H01L 33/18

See application file for complete search history.

(56) References Cited

U.S. PATENT DOCUMENTS

| | | | |
|---|---|---|---|
| 5,231,049 | A | 7/1993 | Neugebauer et al. |
| 6,410,940 | B1 | 6/2002 | Jiang et al. |

(Continued)

OTHER PUBLICATIONS

Tchernycheva et al., "InGaN/GaN Core-Shell Single Nanowire Light Emitting Diodes with Graphene-Based P Contact," Nano Letters 14 (2014) pp. 2456-2465.*

(Continued)

*Primary Examiner* — Jay C Kim

(57) ABSTRACT

Solid state sources offer potential advantages including high brightness, electricity savings, long lifetime, and higher color rendering capability, when compared to incandescent and fluorescent light sources. To date however, many of these advantages have not been borne out in providing white LED lamps for general lighting applications. The inventors have established that surface recombination through non-radiative processes results in highly inefficient electrical injection. Exploiting in-situ grown shells in combination with dot-in-a-wire LED structures to overcome this limitation through the effective lateral confinement offered by the shell, the inventors have demonstrated core-shell dot-in-a-wire LEDs with significantly improved electrical injection efficiency and output power, providing phosphor-free InGaN/GaN nanowire white LEDs operating with milliwatt output power and color rendering indices of 95-98. Additionally, the inventors demonstrate efficient UV nanowire LEDs for medical applications as well as the non-degraded growth of nanowire LEDs on amorphous substrates.

23 Claims, 17 Drawing Sheets

Related U.S. Application Data

(60) Provisional application No. 61/904,493, filed on Nov. 15, 2013, provisional application No. 61/781,806, filed on Mar. 14, 2013.

(56) References Cited

U.S. PATENT DOCUMENTS

| | | | | |
|---|---|---|---|---|
| 6,709,929 | B2 | 3/2004 | Zhang et al. | |
| 6,818,465 | B2 | 11/2004 | Biwa et al. | |
| 7,396,696 | B2 | 7/2008 | Kim et al. | |
| 7,502,401 | B2 | 3/2009 | Miller et al. | |
| 7,595,511 | B2 * | 9/2009 | Kang | H01L 33/08 257/79 |
| 7,829,443 | B2 | 11/2010 | Seifert et al. | |
| 7,947,989 | B2 | 5/2011 | Ha et al. | |
| 8,030,108 | B1 * | 10/2011 | Lee | H01L 21/02639 438/42 |
| 8,093,082 | B2 | 1/2012 | Huang et al. | |
| 8,178,403 | B2 | 5/2012 | Ohlsson et al. | |
| 8,183,587 | B2 * | 5/2012 | Samuelson | B82Y 10/00 257/79 |
| 8,330,173 | B2 * | 12/2012 | Kim | H01L 33/06 257/E33.005 |
| 8,519,378 | B2 | 8/2013 | Hiruma et al. | |
| 8,557,622 | B2 | 10/2013 | Lee et al. | |
| 8,648,328 | B2 * | 2/2014 | Crowder | H01L 33/24 257/E21.112 |
| 8,664,086 | B2 | 3/2014 | Ogihara | |
| 8,669,544 | B2 | 3/2014 | Mi et al. | |
| 8,759,814 | B2 | 6/2014 | Yang et al. | |
| 8,785,905 | B1 * | 7/2014 | Wang | H01L 33/04 257/615 |
| 8,835,903 | B2 | 9/2014 | Gwo et al. | |
| 8,964,020 | B2 | 2/2015 | Hersee | |
| 9,024,292 | B2 * | 5/2015 | Li | H01L 33/32 257/13 |
| 9,076,927 | B2 | 7/2015 | Keller et al. | |
| 9,093,607 | B2 | 7/2015 | Gilet et al. | |
| 9,130,099 | B2 | 9/2015 | Robin | |
| 9,166,106 | B2 * | 10/2015 | Svensson | H01L 21/02603 |
| 9,224,595 | B2 | 12/2015 | Kishino et al. | |
| 9,318,655 | B2 * | 4/2016 | Pedersen | H01L 33/24 |
| 9,537,050 | B2 * | 1/2017 | Gilet | H01L 33/14 |
| 9,570,651 | B2 * | 2/2017 | Svensson | H01L 29/0676 |
| 9,768,350 | B2 | 9/2017 | Bavencove et al. | |
| 10,050,080 | B2 * | 8/2018 | Gilet | H01L 27/15 |
| 10,079,331 | B2 * | 9/2018 | Herner | H01L 33/32 |
| 10,205,054 | B2 * | 2/2019 | Romano | H01L 33/025 |
| 2006/0223211 | A1 | 10/2006 | Mishra et al. | |
| 2008/0157057 | A1 | 7/2008 | Kim | |
| 2011/0089400 | A1 | 4/2011 | Ohlsson et al. | |
| 2011/0126891 | A1 | 6/2011 | Goto et al. | |
| 2011/0127490 | A1 | 6/2011 | Mi | |
| 2012/0205613 | A1 | 8/2012 | Mi et al. | |
| 2013/0270517 | A1 | 10/2013 | Nozawa et al. | |
| 2015/0340548 | A1 | 11/2015 | Cagli | |

OTHER PUBLICATIONS

Deppner et al., "Computational Study of Carrier Injection in III-Nitride Core-Shell Nanowire-LEDs," 2011 Semiconductor Conference Dresden, 27-28 Sep. 27-28, 2011 (2011).*

Li et al., "Three dimensional numerical study on the efficiency of a core-shell InGaN/GaN multiple quantum well nanowire light-emitting diodes," Journal of Applied Physics 113 (2013) 183104.*

Wierer et al., "Ill-nitride core-shell nanowire arrayed solar cells," Sandia Reports (2012).*

Nguyen et al., "Color Tunable Phosphor-Free InGaN/GaN/AlGaN Core-Shell Nanowire Light-Emitting Diodes on Silicon," 2014 Summer Topicals Meeting Series, IEEE (2014).*

Rigutti et al., "Correlation of optical and structural properties of GaN/AlN core-shell nanowires," Physical Review B 83 (2011) 155320.*

Romer et al., Luminescence and Efficiency Optimization of InGaN/GaN Core-Shell Nanowire LEDs by Numerical Modelling, Proceedings of SPIE 8255 (2012) 82550H.*

Allah et al. "Imaging and Analysis by Transmission Electron Microscopy of the Spontaneous Formation of Al-Rich Shell Structure in AlxGal xN/GaN Nanowires", Appl. Phys. Express. vol. 5. 045002, 2012, pp. 1-3, Spain.

Bertelli et al. "Atomic and electronic structure of the nonpolar GaN(1(1)over-banr00) surface". Phys. Rev. B., vol. 80., 2009, 115324, pp. 1-7, Germany.

Bertness et al. « GaN Nanowires Grown by Molecular Beam Epitaxy » IEEE J. Sel. Topics Quant. Electron. vol. 17., 2011, pp. 847-858, Russia.

Bessolov et al. "Chalcogenide passivation of III-V semiconductor surfaces". Semiconductors. vol. 32., Nov. 1998, pp. 1141-1156, Russia.

Bie et al. "Single ZnO Nanowire/p-type GaN Heterojunctions for Photovoltaic Devices and UV Light-Emitting Diodes", Adv. Mater. vol. 22., 2010, pp. 4284-4287, Germany.

Boroditsky et al. "Surface recombination measurements on III-V candidate materials for nanostructure light-emitting diodes". J. App. Phys. vol. 87., Apr. 1, 2000, pp. 3497-3504, United Kingdom.

Calarco et al. "Nucleation and Growth of GaN Nanowires on Si(111) Performed byMolecular Beam Epitaxy", Nano. Lett. vol. 7., May 25, 2007, pp. 2248-2251, USA.

Chen et al. "Photoluminescence enhancement of (NH4)2Sx passivated InP surface by rapid thermal annealing". App. Surf. Sci. vol. 100-101., 1996, pp. 592-595, China.

Chevtchenko et al. "Study of SiN[sub x] and SiO[sub 2] passivation of GaN surfaces" J. App. Phys. vol. 101., 113709, 2007, pp. 1-7, USA.

Chitnis et al. "Self-heating effects at high pump currents in deep ultraviolet light-emitting diodes at 324 nm" Appl. Phys. ett. vol. 81. Oct. 28, 2002, pp. 3491-3493, South Carolina.

Consonni et al. « Nucleation mechanisms of self-induced GaN nanowires grown on an amorphous interlayer », Phys. Rev. B.. vol. 83. 035310, (2011), pp. 1-8, Germany.

Davitt et al. « 290 and 340 nm UV LED arrays for fluorescence detection from single airborne particles » Opt. Express. vol. 13. Nov. 14, 2005, pp. 9548-9555, USA.

Debnath et al. "Mechanism of molecular beam epitaxy growth of GaN nanowires on Si(111)", Appl. Phys. Lett. vol. 90. 123117, 2007, pp. 1-2, Germany.

Geelhaar et al. « Properties of GaN Nanowires Grown by Molecular Beam Epitaxy », IEEE J. Sel. Topics Quant. Electron. vol. 17. 878, 2011, pp. 878-888, Germany.

Jeon et al. "High Performance AlGalnN Ultraviolet Light-Emitting Diode at the 340nm Wavelength", Appl. Phys. Lett. vol. 43., 2004, pp. L1409-L1412, USA.

Jindal et al. "Density functional theoretical study of surface structure and adatom kinetics for wurtzite AIN", J. Appl. Phys. vol. 105. 084902, 2009, pp. 1-6, USA.

Kim et al. "Origin of efficiency droop in GaN-based light-emitting diodes". App. Phys. Lett. vol. 91. 183507, 2007, pp. 1-3, Korea.

Kim et al. "Realization of p-type ZnO thin films via phosphorus doping and thermal activation of the dopant", Appl. Phys. Lett. vol. 83., Jul. 7, 2003, pp. 63-65, Korea.

Koo et al. « Biointegrated flexible inorganic light emitting diodes » Nanobiosens. Dis. Diag. vol. 1., Mar. 14, 2012, pp. 5-15, Republic of Korea.

Leskiewicz et al. "Excitatory Neurosteroids attenuate apoptotic and excitotoxic cell death in primary cortical neurons", J. Physiol. vol. 536., 2008, pp. 471-478, Poland.

Li et al. "Enhanced Thermal Conductivity of Polyimide Films via a Hybrid of Micro- and Nano-Sized Boron Nitride", J. Phys. Chem. B. vol. 114., 2010, pp. 6825-6829, Taiwan.

Li et al., "Optical performance of top-down fabricated InGaN/GaN nanorod light emitting diode arrays", Optical Express 19 (2011) 25528.

Lin et al. "InGaN/GaN nanorod array white light-emitting diode". App. Phys. Lett. vol. 97. (Aug. 2010). pp. 073101 to 073101-3, Taiwan.

(56) References Cited

OTHER PUBLICATIONS

Mayevsky et al. "Mitochondrial function in vivo evaluated by NADH fluorescence: from animal models to human studies", Am. J. Physiol. vol. 292. 2007, pp. C615-C640, Israel.
Mi et al., "Phosphor-free InGaN/GaN/AlGaN core-shell dot-in-a-wire white light emitting diodes", Proceedings of SPIE 9003 (2014) 900306.
Miller « Shining New Light on Neural Circuits », Science. vol. 314. Dec. 15, 2006, pp. 1674-16766, USA.
Monemar et al. "Defect related issues in the 'current roll-off' in InGaN based light emitting diodes". App. Phys. Lett. vol. 91., 181103, 2007, pp. 1-3, Sweden.
Nguyen et al. "Controlling Electron Overflow in Phosphor-Free InGaN/GaN Nanowire White Light-Emitting Diodes", Nano. Lett. vol. 12., 2012, pp. 1317-1323, Canada.
Nguyen et al. "Full-color InGaN/GaN dot-in-a-wire light emitting diodes on silicon". Nanotech. vol. 22., 2011, pp. 1-5, Canada.
Nguyen et al. "High efficiency InGaN/GaN dot-in-a-wire light emitting diodes grown by molecular beam epitaxy on Si (111)". Conference on Lasers and Electro-Optics. (May 2011)., 2011, pp. 1-2, Canada.
Nguyen et al. "High Efficiency InGaN/GaN Dot-in-a-Wire Red Light Emitting Diodes". Phot. Tech. Lett. vol. 24., Feb. 15, 2012, pp. 321-323, Canada.
Nguyen et al. "p-Type Modulation Doped InGaN/GaN Dot-in-a-Wire White-Light-Emitting Diodes Monolithically Grown on Si(111)". Nano Letters. vol. 11., 2011, pp. 1919-1924, Canada.
Nguyen et al., "p-Type Modulation Doped InGaN/GaN Dot-in-a-Wire White-Light-Emitting Diodes Monolithically Grown on Si(111)", Nano Letters 11 (2011) pp. 1919-1924.
Nguyen et al., "Temperature-dependent nonradiative recombination processes in GaN-based nanowire white-light-emitting diodes on silicon", Nanotechnology 23 (2012) 194012.
Oder et al. "III-nitride blue and ultraviolet photonic crystal light emitting diodes", Appl. Phys. Lett. vol. 84., Jan. 26, 2004, pp. 466-468, USA.
Park et al. "Origins of Parasitic Emissions from 353nm AlGaN-based Ultraviolet Light Emitting Diodes over SiC Substrates", J. Appl. Phys. vol. 45. 4083, 2006, pp. 4083-4086, USA.
Peng et al. « Ultraviolet light-emitting diodes operating in the 340 nm wavelength range and application to time-resolved fluorescence spectroscopy », App. Phys. Lett. vol. 85., Aug. 23, 2004, pp. 1436-1438, USA.
Reed et al. "Device self-heating effects in deep UV LEDs studied by systematic variation in pulsed current injection", Phys. Status Solidi c. vol. 5., 2008, pp. 2053-2055, USA.
Rothman et al. « Optical Suppression of Seizure-Like Activity with an LED », Epilepsy Res. vol. 74., May 2007, pp. 201-209, USA.
Rozhansky et al. "Analysis of the causes of the decrease in the electroluminescence efficiency of AlGalnN light-emitting-diode heterostructures at high pumping density". Semiconductors. vol. 40., 2006, pp. 839-845, Russia.
Shen et al. "Auger recombination in InGaN measured by photoluminescence". App. Phys. Lett. vol. 91., 2007, 141101, pp. 1-3, USA.
Shitara et al. "Reflection high-energy electron diffraction intensity oscillations and anisotropy on vicinal AlAs(001) during molecular-beam epitaxy", Appl. Phys Lett. vol. 62., 1993, pp. 1658-1660, United Kingdom.
Smith et al. "341 nm emission from hydride vapor-phase epitaxy ultraviolet light-emitting diodes", Appl. Phys. Lett. vol. 95. Jun. 15, 2004, pp. 8247-8251, USA.
Songmuang et al. "Identification of III—N nanowire growth kinetics via a marker technique", Nanotechnology. vol. 21. 295605, 2010, pp. 1-4, France.
Stoica et al. « Interface and Wetting Layer Effect on the Catalyst-Free Nucleation and Growth of GaN Nanowires », Small. vol. 4., 2008, pp. 751-754, Germany.
Tajik et al. "Photoluminescence model of sulfur passivated p-InP nanowires". Nanotech. vol. 23., 315703, 2012, pp. 1-6, Canada.
Van De Walle et al. "Microscopic origins of surface states on nitride surfaces", J. App. Phys., vol. 101, 2007, pp. 1-19, USA.
Wang et al. "Greatly improved performance of 340 nm light emitting diodes using a very thin GaN interlayer on a high temperature AlN buffer layer", Appl. Phys. Lett. vol. 89. 081126, 2006, pp. 1-3, United Kingdom.
Wang et al. "High efficiency ultraviolet emission from AlxGa12xN core-shell nanowire heterostructures grown on Si (111) by molecular beam epitaxy", Appl. Phys. Lett. vol. 101. 043115, 2012, pp. 1-4, Canada.
Xu et al. « AlGaN multiple-quantum-well-based, deep ultraviolet light-emitting diodes with significantly reduced long- wave emission », J. Phys. D : Appl. Phys. vol. 41. 094013, pp. 1-13, USA.
Zhang & Chen et al. "Recombination dynamics in ultraviolet light-emitting diodes with Si-doped Al x Ga 1-x N/Al y Ga 1-y N multiple quantum well active regions", J. Appl. Phys. vol. 101. 113102, 2007, pp. 1-5, USA.
Zhang et al. "AlGaN multiple-quantum-well-based, deep ultraviolet light-emitting diodes with significantly reduced long-wave emission", Appl. Phys. Lett. vol. 83., Oct. 27, 2003, pp. 3456-3458, South Carolina.
Zhang et al. "Fabrication of a High-Brightness Blue-Light-Emitting Diode Using a ZnO-Nanowire Array Grown on p-GaN Thin Film", Adv. Mater. vol. 21., 2009, pp. 2767-2770, Germany.
Zhang et al. "Suppression of the subband parasitic peak by 1 nm i-Al N interlayer in AlGaN deep ultraviolet light-emitting diodes", Appl. Phys. Lett. vol. 93. 131117, 2008, pp. 1-3, Japan.
Zhao et al. "Tuning the Surface Charge Properties of Epitaxial InN Nanowires", Nano. Lett. vol. 12., 2012, pp. 2877-2882, USA.
Zhao, S et al. "Growth of large-scale vertically aligned GaN nanowire heterostructures with high uniformity on SiOx by catalyst-free molecular beam epitaxy"., Apr. 9, 2013, pp. 1-8, Canada.
Zhou et al. "Enhanced high thermal conductivity and low permittivity of polyimide based composites by core-shell Ag@SiO2 nanoparticle fillers", Appl. Phys. Lett. vol. 101., 2012, pp. 1-4, China.
Zhou et al. "Vertical injection thin-film Al Ga N/Al Ga N multiple-quantum-well deep ultraviolet light-emitting diodes", Appl. Phys. Lett. vol. 89. 241113, 2006, pp. 1-3, USA.

* cited by examiner

Figure 10
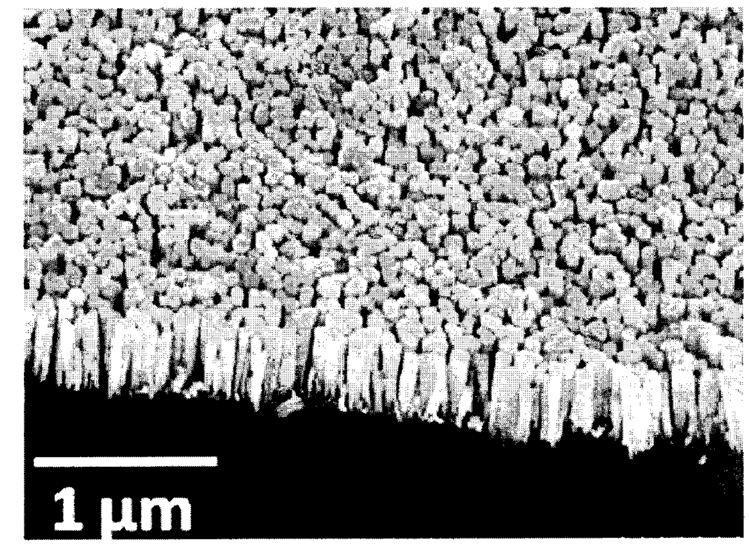
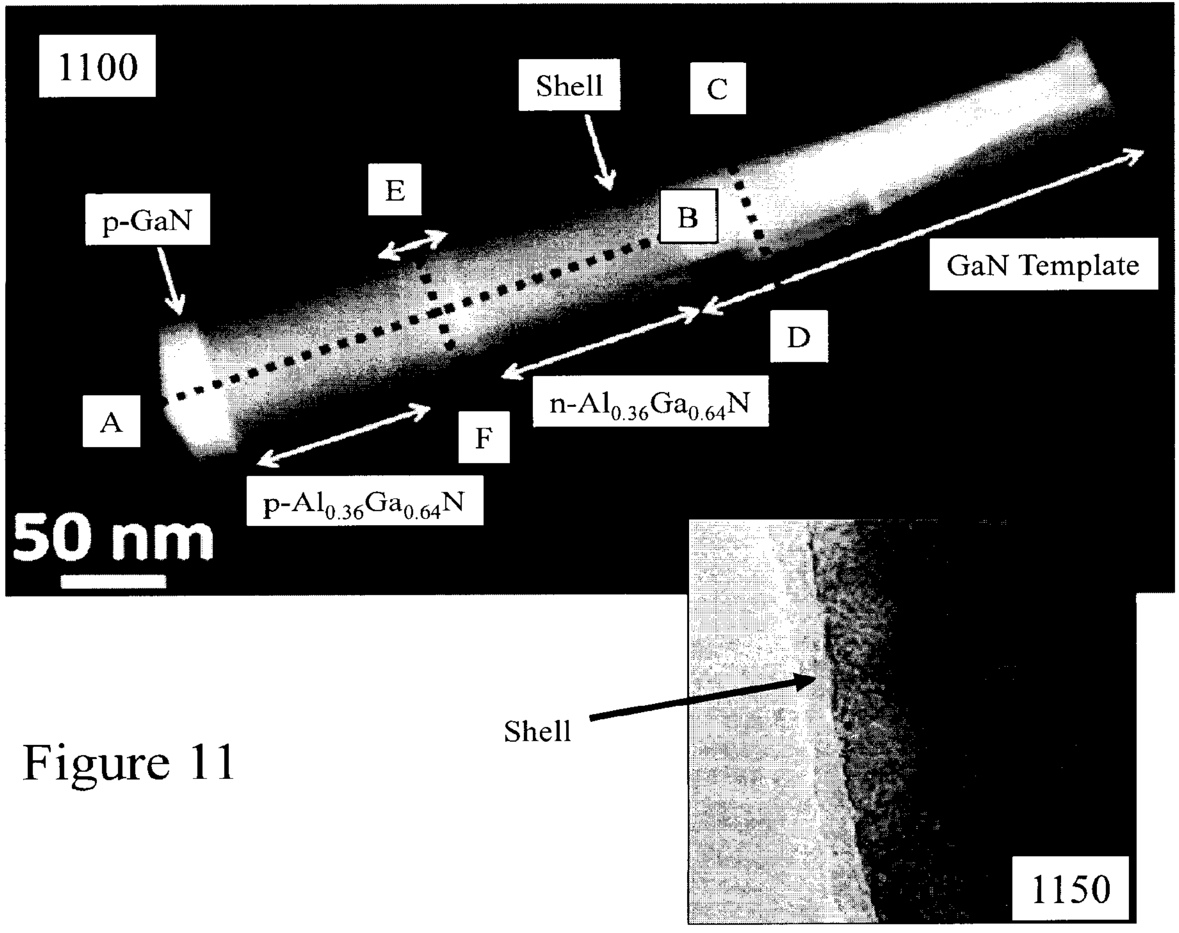
Figure 11

Intensity (a.u.)
Longitudinal Profile A-B
Ga
Al
In
100
80
60
40
20
0
0
50
100
150
200
250
300
Distance (nm)

Intensity (a.u.)
Axial Profile C-D
Ga
Al
In
250
200
150
100
50
0
0
20
40
60
80
Distance (nm)

Intensity (a.u.)
Axial Profile E-F
Al
Ga
Shell
In
150
100
50
0
0
20
40
60
80
100
120
Distance (nm)

Figure 20A
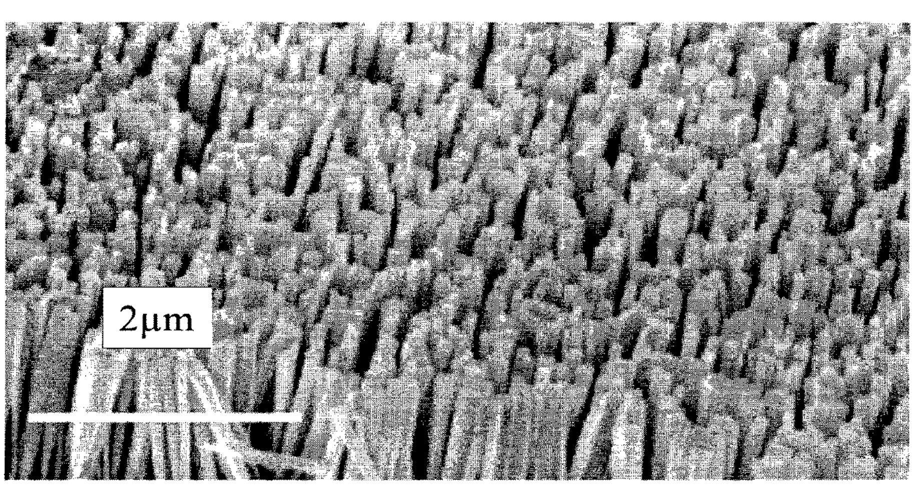
Figure 20B
Figure 20C
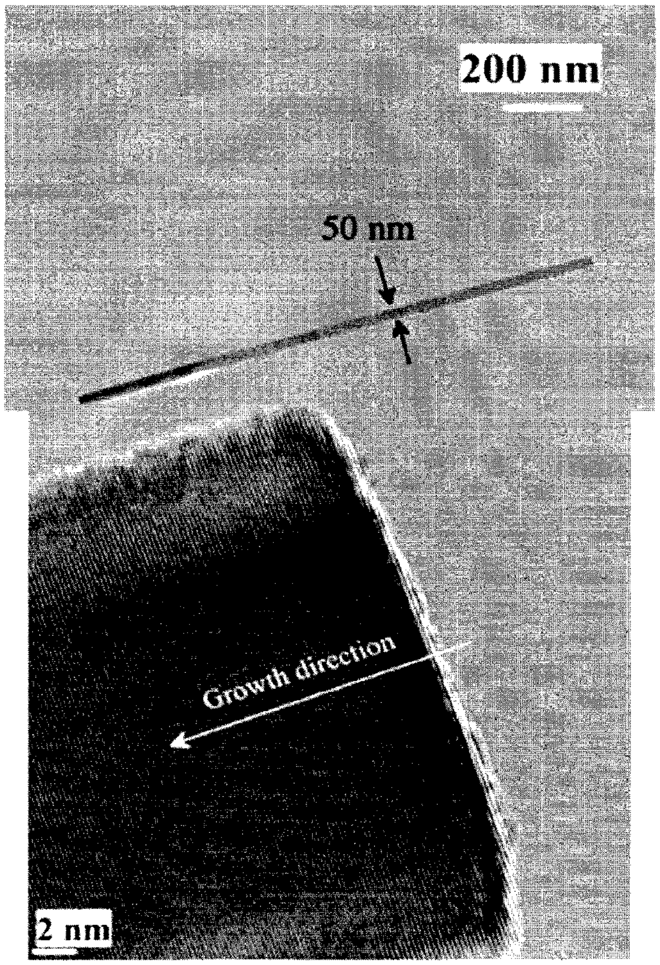

METHODS AND DEVICES FOR SOLID STATE NANOWIRE DEVICES

CROSS-REFERENCE TO RELATED APPLICATIONS

This patent application is a continuation of U.S. patent application Ser. No. 14/776,120 filed Sep. 14, 2015, entitled "Methods and Devices for Solid State Nanowire Devices," now U.S. Pat. No. 11,502,219, which claims the benefit of U.S. Provisional Patent No Application 61/781,806 filed Mar. 14, 2013, entitled "Methods and Devices for Solid State Nanowire Devices" and U.S. Provisional Patent Application No. 61/904,493 filed Nov. 15, 2013, entitled "GaN Nanowires on Silicon Oxide," which are all hereby incorporated by reference.

FIELD OF THE INVENTION

This invention relates to semiconductor nanowire devices and more specifically to quantum dot nanowire solid state optical emitters.

BACKGROUND OF THE INVENTION

In the last two decades, tremendous progress has been made for GaN-based light emitting diodes (LEDs) for solid state lighting applications. Solid state lighting offers potential advantages including high brightness, electricity savings, long lifetime, and higher color rendering capability, when compared to the traditional incandescent and fluorescent light sources. To date however, many of these advantages, however, have not been borne out in providing white LED lamps, wherein typically a UV phosphor is utilized to generate white light emission from a blue LED light engine. The use of the phosphor not only reduces the ultimate efficiency and increase the manufacturing cost of an LED light engine but also significantly degrades the lamp lifetime and light quality, which, in conjunction with the "green gap" and "efficiency droop" of GaN-based quantum well LEDs have been identified as the major challenges for the current solid state lighting technologies, see for example Kim et al in "Origin of efficiency droop in GaN-based light-emitting diodes" (App Phys. Lett., Vol. 91, p. 183507), Rozhansky et al in "Analysis of the causes of the decrease in the electroluminescence efficiency of AlGaInN light-emitting-diode heterostructures at high pumping density" (Semiconductors, Vol. 40, pp. 839-845), and Monemar et al in "Defect related issues in the 'current roll-off' in InGaN based light emitting diodes" (App. Phys Lett., Vol. 91, p. 181103).

An alternative and more appealing approach is to develop phosphor-free white LEDs, which, through the direct generation and manipulation of light at different parts of the visible spectral range, should provide solid state light sources with the highest efficiency, longest lifetime, and best light quality, compared to existing lighting technologies. In this regard, phosphor-free III-nitride nanowires LEDs have been intensively studied, wherein III refers to elements within Group III of the Periodic Table. These devices have already shown relatively high internal quantum efficiency, tunable emission across the entire visible spectral range, and droop-free operation. However, to date these devices have generally exhibited extremely low output power in the range of nW or μW [references]. Such low output power is in direct contrast to the reported high internal quantum efficiency of such LED light sources and cannot be simply attributed to the relatively low light extraction efficiency of devices grown on sapphire or Si substrates.

The inventors have performed a detailed investigation of the impact of surface recombination on the performance of nanowire LEDs wherein they have shown that carrier injection into the nanowire LED active region is a highly inefficient process, due to the non-radiative recombination associated with the presence of surface states and defects. This is in direct contrast to the near-unity electrical injection efficiency within conventional quantum well LEDs. Accordingly, the inventors have established that this critical process has been neglected in previous nan wire LED studies and developments. The inventors have observed that the electrical injection efficiency of a nanowire LED can be substantially improved by reducing the non-radiative sur e recombination process within these structures. The inventors have achieved this by utilizing an in-situ grown AlGaN shell surrounding the InGaN/GaN dot-in-a-wire LED structures. Accordingly, as a result of the effective lateral confinement offered by the AlGaN shell, the non-radiative surface recombination process is drastically reduced, leading to significantly improved electrical injection efficiency and output power, compared to conventional nanowire LEDs.

The inventors have combined this AlGaN shell in conjunction with self-organized InGaN quantum dots embedded in defect-free GaN nanowire arrays exploiting growth techniques previously established by the inventors. Accordingly, using these solid state quantum dot nanowires the inventors have not only demonstrated white-light emission but also that the LED light source emission properties, including the color temperature and color rendering index, can be engineered by varying the size and composition of the dots in a single epitaxial growth step within their manufacturing. Accordingly, the inventors have demonstrated and describe within this specification embodiments of the invention phosphor-free InGaN/GaN nanowire white LEDs that can operate in the milliwatt output power range (measured under 1-10% duty cycle) and can deliver an unprecedentedly high color rendering indices of 95-100, compared with prior art phosphor-based LED lamps.

Other aspects and features of the present invention will become apparent to those ordinarily skilled in the art upon review of the following description of specific embodiments of the invention in conjunction with the accompanying figures.

SUMMARY OF THE INVENTION

It is an object of the present invention to semiconductor nanowire devices and more specifically to quantum dot nanowire solid state optical emitters.

In accordance with an embodiment of the invention there is provided a device comprising:

a nanowire comprising;

a lower portion of a first semiconductor comprising at least a group III element and doped so as to be n-type;

a central portion of the first semiconductor comprising at least one quantum structure of a plurality of quantum structures;

an upper portion of the first semiconductor comprising at least the group III element and doped so as to be p-type; and an outer shell formed around the periphery of the nanowire comprising a second semiconductor having a larger bandgap than that of the first semiconductor.

In accordance with an embodiment of the invention there is provided a device comprising:

a nanowire formed from at least a first semiconductor comprising p-doped, intrinsic, and n-doped regions;

at least a quantum structure of a plurality of quantum structures within the intrinsic region of the nanowire; and a shell surrounding the nanowire increasing electrical confinement within a predetermined portion of the nanowire.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 10 depicts a 45° tilted SEM image of a typical AlGaN DH nanowire with shell structure LED according to an embodiment of the invention;

FIG. 11 depicts a HAADF-STEm image of a single AlGaN DH nanowire with shell structure LED according to an embodiment of the invention;

FIGS. 20A to 20C depict SEM images of GaN nanowires grown on $SiO_x$ templates taken at 45° tilt together with a low magnification TEM image of a single GaN nanowire and a high resolution TEM image of the bottom of a single GaN nanowire;

DETAILED DESCRIPTION

The present invention is directed to semiconductor nanowire devices and more specifically to quantum dot nanowire solid state optical emitters.

The ensuing description provides exemplary embodiment(s) only, and is not intended to limit the scope, applicability or configuration of the disclosure. Rather, the ensuing description of the exemplary embodiment(s) will provide those skilled in the art with an enabling description for implementing an exemplary embodiment. It being understood that various changes may be made in the function and arrangement of elements without departing from the spirit and scope as set forth in the appended claims.

Within the experiments reported below for devices the inventors have exploited vertically aligned InGaN/GaN dot-in-a-wire LED heterostructures grown on Si (111) substrates by radio-frequency plasma-assisted molecular beam epitaxy under nitrogen-rich conditions. Descriptions of such structures can be found for example within US Patent Application 2011/0,127,490 entitled "Method of Growing Uniform Semiconductor Nanowires without Foreign Metal Catalyst and Devices Therefrom" and US Patent Application 2012/0,205,613 entitled "High Efficiency Broadband Semiconductor Nanowire Devices and Methods of Fabricating without Foreign Catalyst," both by the inventors, the contents of which are included in their entirety by this reference.

A. Core-Shell Dot-in-a-Wire Light Emitters

Figures 1A, 1B, 1C:
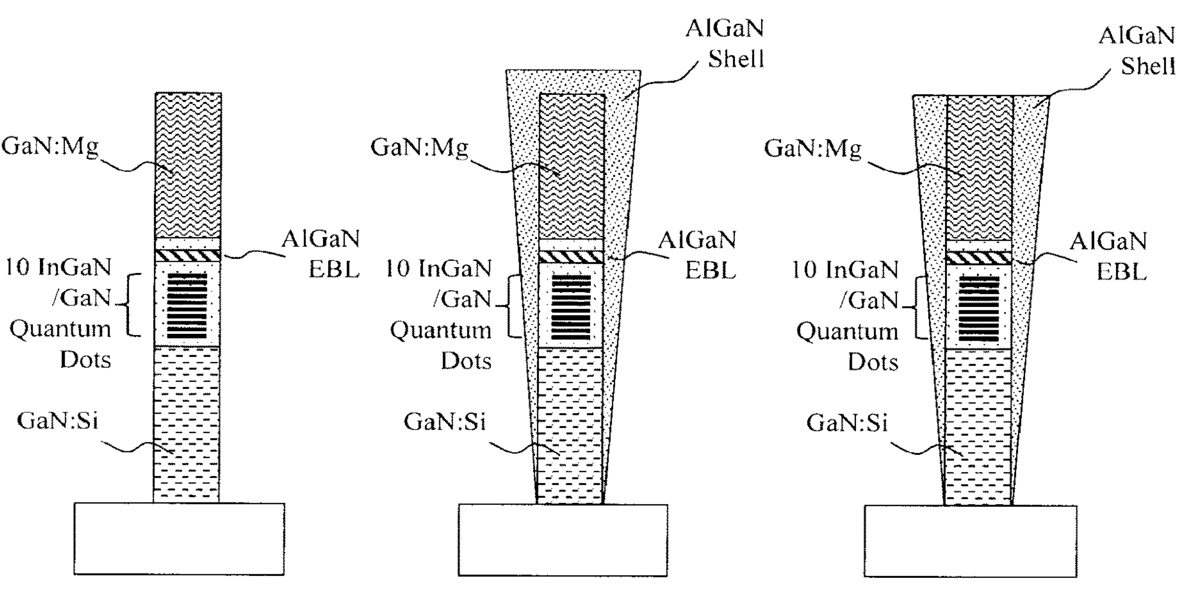
FIG. 1A depicts a schematic illustration of an InGaN/GaN dot-in-a-wire LED structure according to the prior art.
FIGS. 1B and 1C depict schematic illustrations of InGaN/GaN/AlGaN core-shell LED structures during processing after shell formation and post-removal of the AlGaN capping layer for subsequent contact metallization according to embodiments of the invention.

Referring to FIG. 1A there is depicted a dot-in-a-wire LED structure typical of those consists of ~0.4 μm GaN:Si bottom section, ten vertically coupled InGaN/GaN dots, and a ~0.2 μm GaN Mg upper section. In order to reduce and potentially prevent the electron overflow within such devices, a ~10 nm p-doped AlGaN electron blocking layer (EBL) was incorporated between the InGaN/GaN dot active region and upper GaN:Mg section Ten InGaN/GaN dots are embedded in the device active region, which, depending on the indium composition and dot sizes, can deliver white light emission with well controlled properties, see US Patent Applications 2011/0,127,490 and 2012/0,205,613 by the inventors. According to embodiments of the invention as AlGaN shell was grown covering the top as well as the lateral surfaces of the dot-in-a-wire structure, as shown schematically shown in FIG. 1B. The AlGaN shell surrounding the dot-in-a-wire active region can contribute to the effective reduction of non-radiative surface recombination, thereby leading to enhanced carrier recombination within the active region. Subsequently, the top of the AlGaN capping layer was etched using a reactive ion etching process during the device fabrication process, as illustrated in FIG. 1C. As evident in FIG. 1D from a 45 degree-titled scanning electron microscopy (SEM) image for typical InGaN/GaN/AlGaN dot-in-a-wire core-shell heterostructure grown on Si (111) substrate by the inventors the InGaN/GaN/AlGaN core-shell dot-in-a-wire LED's exhibit extremely high density and size uniformity.

B. Visible Wavelength Core-Shell Dot-in-a-Wire Light Emitters

B1: Visible Core-Shell Dot-in-Wire Fabrication: These vertically aligned InGaN/GaN dot-in-a-wire heterostructures were grown on n-Si (111) substrates using a molecular beam epitaxy system equipped with a radio-frequency plasma-assisted nitrogen source under nitrogen rich condition without the use of any external catalyst, see US Patent Applications 2011/0,127,490 and 2012/0,205,613 by the inventors Prior to growth of the LEDs, the oxide on the silicon substrate surface was removed in situ at ~770° C. During the growth sequence, nitrogen flow rate was kept at 1.0 sccm, with a forward plasma power of ~350 W. The LED device heterostructure being predominantly grown at ~750° C., whilst the InGaN/GaN quantum dots were grown at relatively low temperatures of 570-630° C. Each InGaN/GaN dot consists of ~3 nm InGaN separated by ~3 nm GaN barrier layers. Each quantum dot layer is also modulation doped p-type using Mg to enhance the hole transport. After the GaN:Mg top section was grown, a thick layer of AlGaN of ~80 nm was grown for the formation of the shell surrounding the InGaN/GaN core. Accordingly, InGaN/GaN/AlGaN core-shell dot-in-a-wire LED structures according to embodiments of the invention include the InGaN/GaN dot-in-a-wire core region and an AlxGa1-xN shell layer. The formation of AlGaN shell is directly related to the diffusion-controlled growth mechanism. The thickness and Al content of AlGaN shell can be well controlled by the growth duration in combination with the Al and Ga deposition rates, respectively. For comparison, the growth conditions for the core-region of the InGaN/GaN/AlGaN core-shell dot-in-a-wire LED heterostructures according to embodiments of the invention were kept the same as that of InGaN/GaN dot-in-a-wire LED without shell. It would be evident to one skilled in the art that the AlGaN shell may be incorporated within the nanowire LED growth at various stages.

B2: Core-Shell Dot-in-a-Wire Device Fabrication: Once fabricated the InGaN/GaN/AlGaN core-shell dot-in-a-wire nanowires were spin-coated with polyimide resist for surface planarization, followed by an oxygen plasma dry etching process to reveal the top sections of the dot-in-a-wire heterostructures. The thick AlGaN layer on the top of nanowires was completely removed by an $Al_2Br_2$ dry etching process. Next Ni(5 nm)/Au(5 nm)/indium tin oxide (ITO) and Ti/Au layers were deposited on the exposed wire surface and backside of the Si substrate respectively to form the p- and n-metal contacts, respectively. The fabricated devices with Ni/Au and Ti/Au metal contacts were first annealed at ~500° C. for 1 minute in nitrogen ambient. Upon the deposition of the ITO transparent contact, a second annealing step was performed at 300° C. in vacuum for ~1 hour Multiple metal grid patterns were deposited on the device surface to facilitate the hole transport and injection processes.

Figures 2A, 2B, 2C, 2D, 2E:
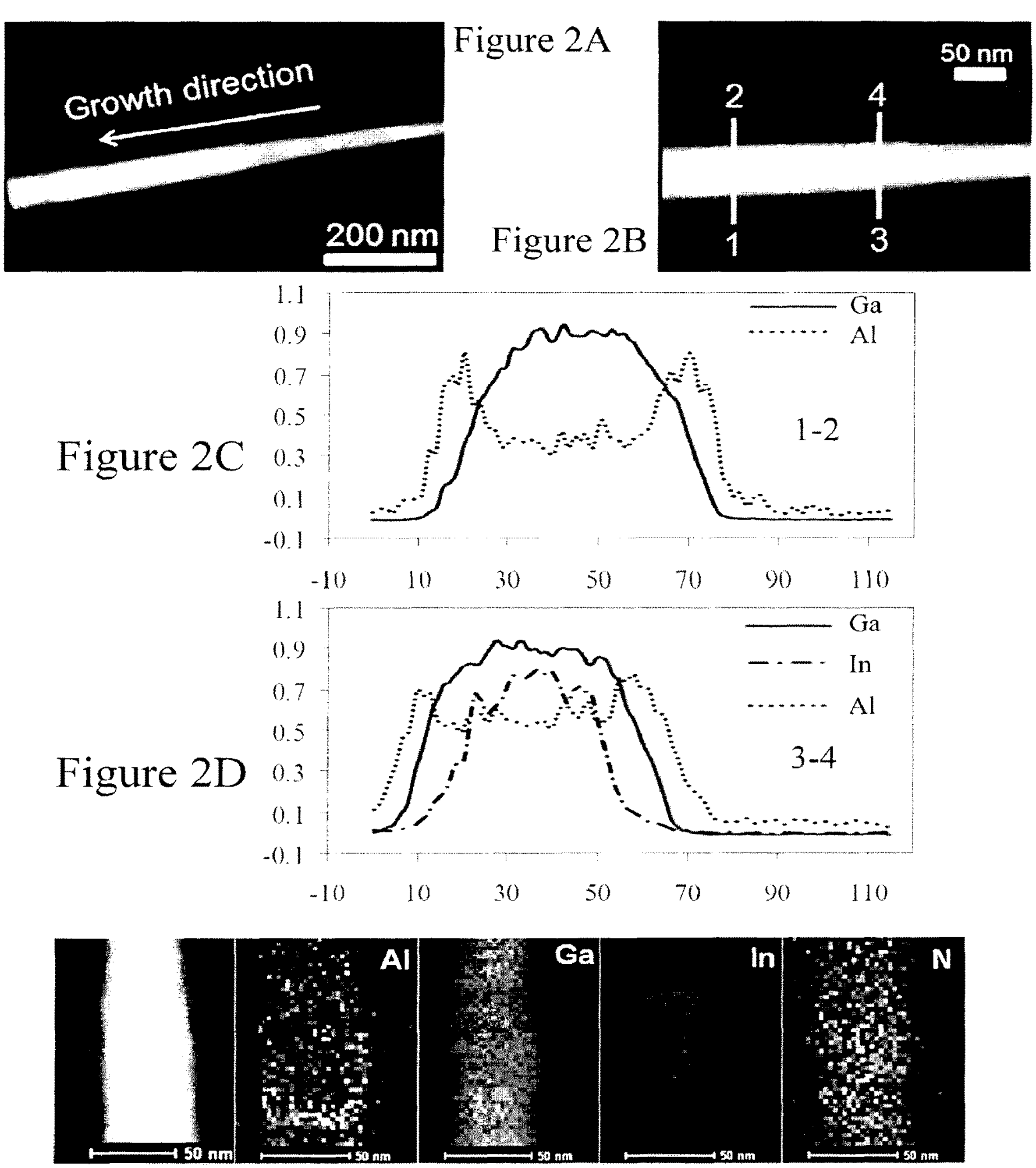
FIGS. 2A and 2B depict bright field scanning transmission electron microscopy images of a InGaN/GaN/AlGaN core-shell dot-in-a-wire LED according to an embodiment of the invention.
FIGS. 2C and 2D depict EDXS line scans analysis performed along lateral directions within the active regions respectively for an InGaN/GaN/AlGaN core-shell dot-in-a-wire LED according to an embodiment of the invention.
FIG. 2E depicts EDX elemental mapping images of an InGaN/GaN quantum dot active region an InGaN/GaN/AlGaN core-shell dot-in-a-wire LED according to an embodiment of the invention.

B3: Core-Shell Dot-in-a-Wire Structural Analysis: Structural properties of InGaN/GaN/AlGaN dot-in-a-wire core-shell heterostructures according to embodiments of the invention were performed by scanning transmission electron microscopy (STEM) and energy dispersive x-ray spectrometry (EDXS) analysis. Referring to FIG. 2A there is depicted a high angle annular dark field (HAADF) image of a single InGaN/GaN/AlGaN nanowire taken with an annular dark field (ADF) detector inner angle of β=69 mrad Typical nanowires were nearly ~800 nm long and their diameters increased from ~30 nm to ~70 nm along the growth direction. FIG. 2A clearly shows the atomic number contrast of AlGaN cap layer, GaN layer and InGaN layer. FIG. 2B depicts a HAADF image of a nanowire at higher magnification together with lines 1-2 and 3-4 drawn to show where lateral analysis using EDXS was performed, the results of which are presented in FIGS. 2C and 2D respectively. Referring to FIG. 2C depicting the lateral EDXS analysis through the GaN:Mg upper section then it is evident that the gallium (Ga) signal is maximum in the nanowire center and drops near the sidewalls. In contrast, the aluminum (Al) signal shows clear peaks near the side walls and a clear dip in the core region of the nanowire, confirming the AlGaN formed shell layer surrounding the GaN:Mg core.

Now referring to FIG. 2D representing lateral EDXS analysis through a quantum dot region of the nanowire the indium (In) signal is confined in the core region of the nanowire indicating the fact that AlGaN formed shell surrounds the InGaN/GaN core region. The thicknesses of AlGaN on the top and sidewall of the nanowire were measured to be ~70 nm and ~8 nm, respectively. The thicker AlGaN formed on the top of the nanowires rather than the sidewall is attributed to the shadowing effect due to the high density of nanowire arrays within the test samples, as evident from FIG. 1D. EDX elemental mapping image of the InGaN/GaN quantum dot active region, illustrated in FIG. 2E, further provides unambiguous evidence that the AlGaN shell layer passivates the InGaN/GaN core region, forming a unique core-shell dot-in-a-wire nanowire heterostructure. Importantly, no visible defects such as dislocations or stacking faults are observed in either the InGaN/GaN quantum dot active region or the AlGaN shell.

Figure 3:
FIG. 3 depicts photoluminescence spectra for an InGaN/GaN/AlGaN core-shell dot-in-a-wire LED according to an embodiment of the invention compared to a sample without the shell.
Figure 3:
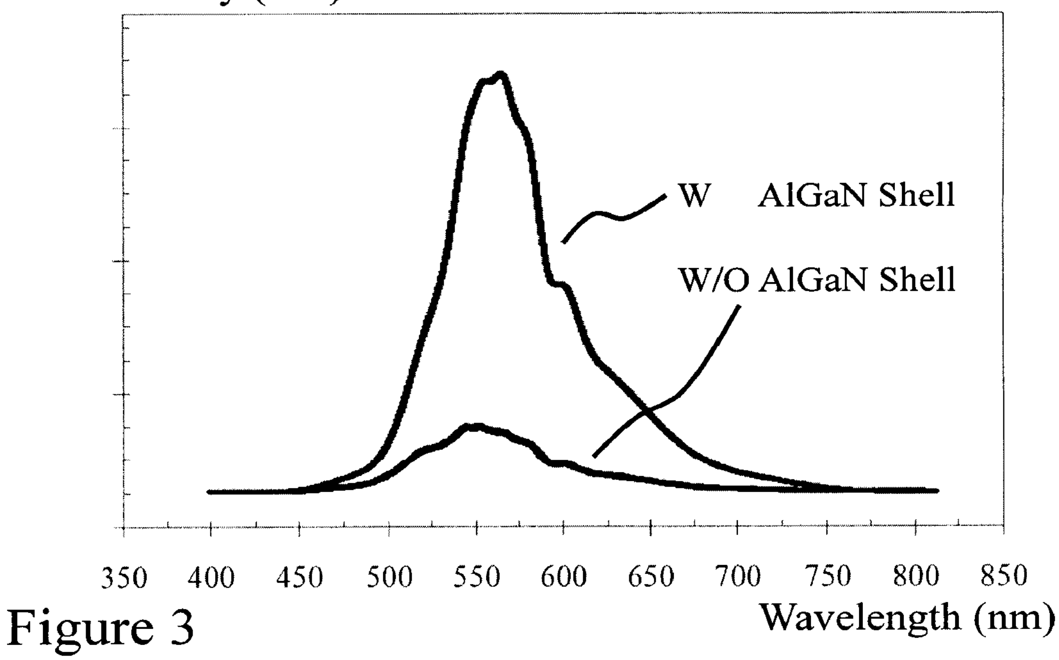
Figure 6:
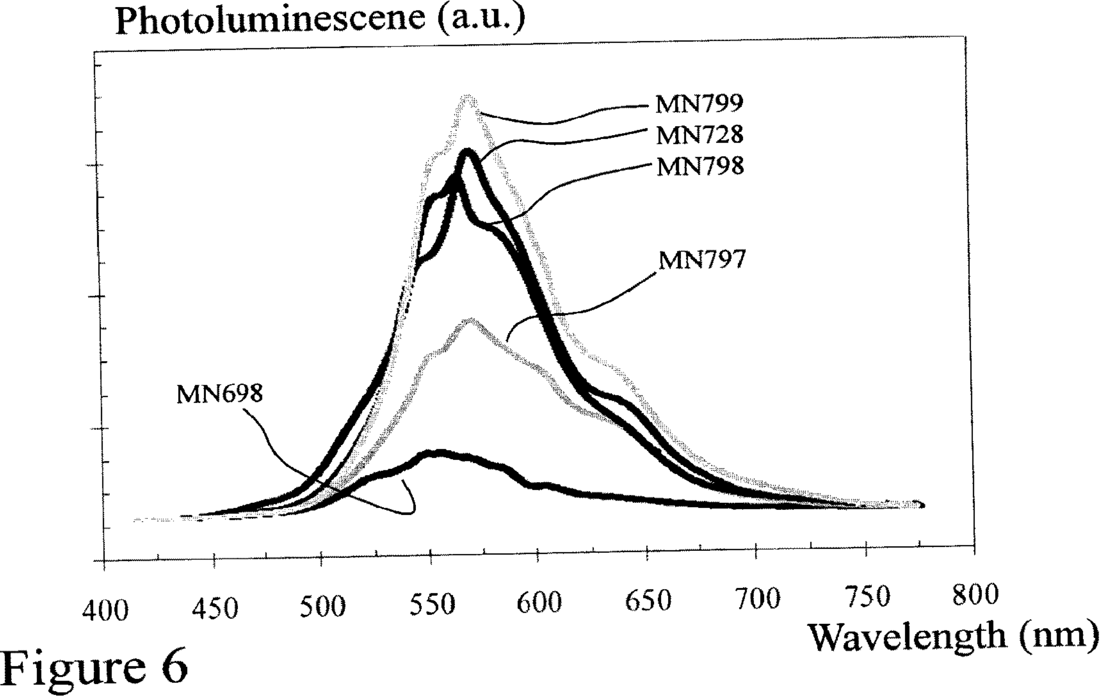
FIG. 6 depicts photoluminescence spectra of core-shell dot-in-a-wire LED s with varying shell designs according to embodiments of the invention compared to prior art nanowire LEDs without shell coverage.

Photoluminescence (PL) emission characteristics of the core-shell dot-in-a-wire LED structures according to embodiments of the invention were measured using 405 nm laser excitation at room-temperature. These results are presented in FIG. 3A together with the PL spectrum measured for an identical dot-in-a-wire LED structure but without shell coverage. From this it can be seen that the core-shell dot-in-a-wire LED sample exhibits significantly improved optical intensity, which is attributed to the drastically reduced non-radiative surface recombination arising from the effective lateral confinement offered by the large bandgap AlGaN shell. Additional measurements and more detailed optical measurement results under 325 nm laser excitation on the core-shell dot-in-a-wire LED s according to embodiments of the invention have been performed by the inventors, including carrier lifetime, temperature and power-dependent PL emission, and the comparison with dot-in-a-wire LEDs without shells. It would be evident that the AlGaN shell can be further engineered by varying the Al composition and the shell thickness. The resulting enhancement in the PL intensity, depending on the design of the shell structure, is shown in FIG. 6 and described below.

In order to study the effect of AlGaN shell on the LED performance, the inventors engineered the AlGaN shell layers by varying its thickness and Al content. The Al content and the thickness of AlGaN shell can be controlled by adjusting the aluminum cell temperature and the AlGaN growth duration, respectively. Samples MN728, MN798, and MN799 were grown at the same substrate temperature and Al cell temperature (980° C.). To vary the AlGaN shell thickness, the growth durations were 40, 60, and 80 minutes respectively for samples MN728, MN799, and MN798. Sample MN797 was grown with an increased Al cell temperature of 1000° C. for 40 min. As evident from FIG. 6 all core-shell dot-in-a-wire LED devices according to embodiments of the invention show stronger PL intensity compared to that of an as-grown sample without core-shell structure, MN698. The inventors have also analysed the variations in carrier lifetime of these samples and their comparison with nanowire LEDs without shell.

Within the prior art the presence of unoccupied Ga dangling bonds and/or large densities of surface defects along the nonpolar GaN(1(1)1over-bar00) surface (m-plane) has been identified within nanowires which can lead to a Fermi-level pinning on the nanowire lateral surfaces, see for example Van de Walle et al in "Microscopic origins of surface states on nitride surfaces" (J. App. Phys., Vol. 101, p. 6) and Bertelli et al in "Atomic and electronic structure of the nonpolar GaN(1(1)over-bar00) surface" (Phys. Rev. B. Vol. 80, p. 115324). The inventors have studied the roles that these surface states/defects on the operation of nanowire LEDs through simulations, using the program APSYS which provides Advanced Physical Models of Semiconductor Devices based on 2D/3D finite element analysis. One important parameter in the simulation is the surface recombination velocity, which is directly related to the density of surface states. Simulations by the inventors have employed values in the range of $\sim 10^3 \leq v \leq 10^5$ cm/s, see Shen et al in "Auger recombination in InGaN measured by photoluminescence" (App. Phys. Lett., Vol. 91, p. 141101) and Rozhansky. Accordingly, the inventors have analysed the calculated electrical injection efficiency for nanowire LEDs with different surface recombination velocities.

From these simulations the inventor have found that the electrical injection efficiency is extremely low (<10%) for nanowires with relatively high surface recombination velocity ($>10^4$ cm/s). Such low carrier injection efficiency is largely responsible for the extremely low output power commonly measured in nanowire LEDs. However, within core-shell dot-in-a-wire LED structures according to embodiments of the invention, the AlGaN shell passivation effectively prevents native oxide from forming on the nanowire surface. It can further reduce the density of mid-gap surface states, see Bessolov et al in "Chalcogenide passivation of III-V semiconductor surfaces" (Semiconductors, Vol. 32, pp. 1141-1156), and surface traps and therefore lead to reduced surface non-radiative recombination, see for example Chevtchenko et al in "Study of SiN[sub x] and SiO[sub 2] passivation of GaN surfaces" (J. App. Phys, Vol. 101, p. 113709), Boroditsky et al in "Surface recombination measurements on III-V candidate materials for nanostructure light-emitting diodes" (J. App. Phys., Vol. 87, pp. 3497-3504), Chen et al in "Photoluminescence enhancement of (NH4)2Sx passivated InP surface by rapid thermal annealing" (App. Surf. Sci., Vol. 100-101, pp. 592-595), and Tajik et al in "Photoluminescence model of sulfur passivated p-InP nanowires" (Nanotech, Vol. 23, p. 315703). Accordingly, the inventors have established that the electrical injection efficiency can be substantially improved such that an injection efficiency of >80% can be achieved for surface recombination velocities of $<10^3$ cm/s.

B4: Visible Core-Shell Dot-in-Wire Light Emitting Diode Optical Performance: As discussed supra the InGaN/GaN/AlGaN core-shell dot-in-a-wire nanowire device fabrication process according to embodiments of the invention include surface passivation by spin-coating polyimide, reactive ion etching, photolithography, and metallization processes. Further, the AlGaN capping layer on top of nanowires was completely removed by a dry etching process before the depositing top-metal contacts. Whilst the AlGaN shell was only approximately 8 nm thick on the sidewalls of the fabricated nanowires this may be increased through control of the nanowire fabrication process through nanowire placement and controlled density together with deposition processing conditions rather than the very high nanowire density employed in these experiments. However, as evident from the experimental results presented below in respect of FIGS. 4A through 5B as well as FIGS. 3 and 6 described supra even such a thin shell has significant impact on the performance of the nanowires. Additional details in respect of manufacturing processes may be found in publications from the inventors, see for example Nguyen et al in "Full-color InGaN/GaN dot-in-a-wire light emitting diodes on silicon" (Nanotech., Vol. 22, p. 445202, hereinafter Nguyen1), "p-Type Modulation Doped InGaN/GaN Dot-in-a-Wire White-Light-Emitting Diodes Monolithically Grown on Si(111)" (Nano Letters, Vol. 11, pp. 1919-1924, Nguyen2), and "High Efficiency InGaN/GaN Dot-in-a-Wire Red Light Emitting Diodes" (Phot Tech. Lett., Vol. 24, pp. 321-323).

Figure 4A:
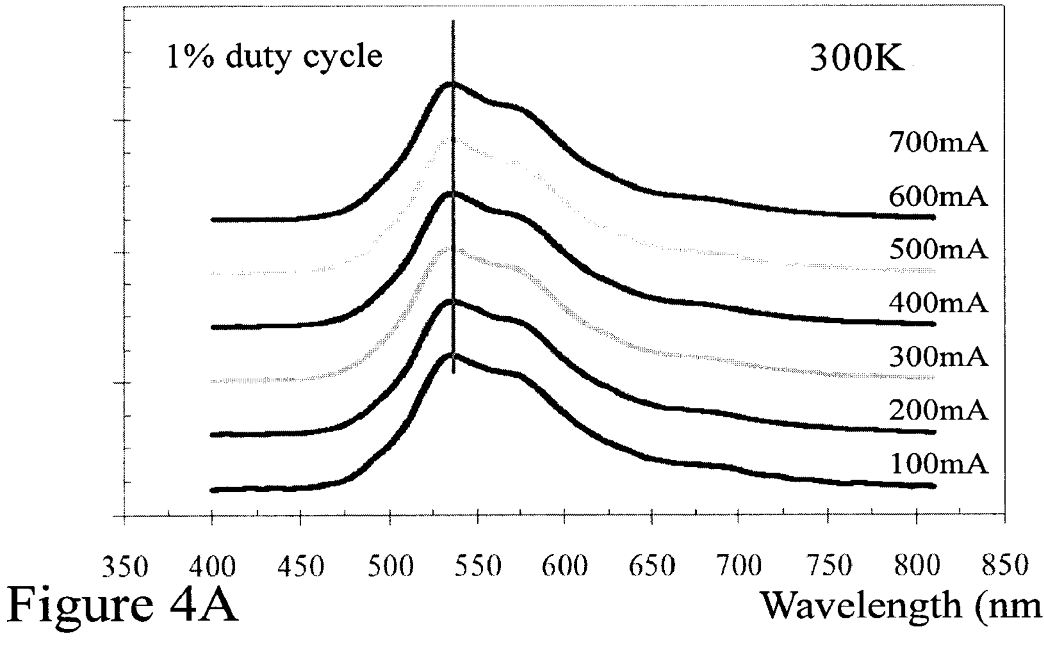
FIG. 4A depicts electroluminescence spectra of a core-shell dot-in-a-wire LED nanowire LED according to an embodiment of the invention measured under different injection currents.
Figure 4B:
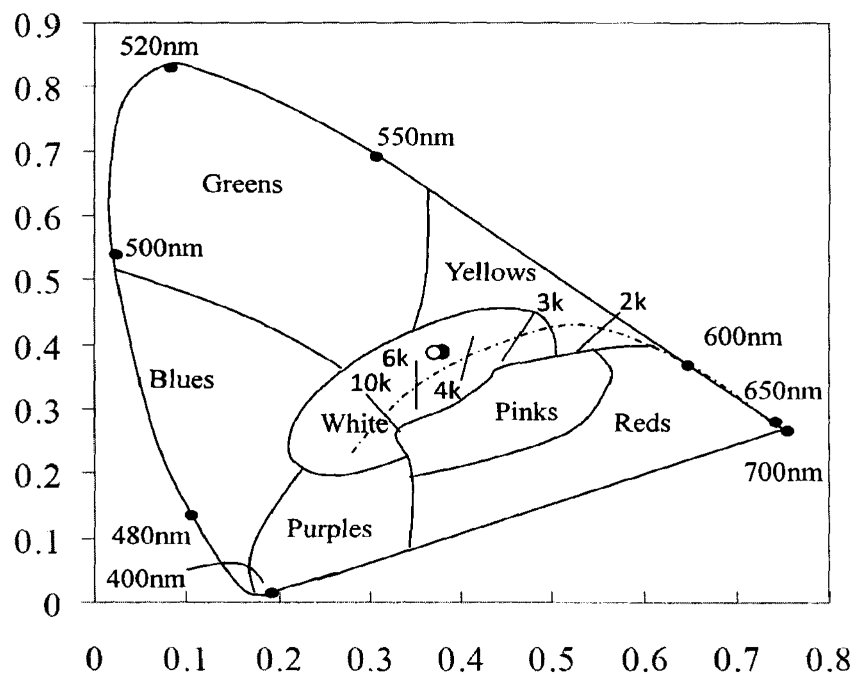
FIG. 4B depicts the CIE diagram for InGaN/GaN/AlGaN core-shell dot-in-a-wire LED nanowire LEDs according to an embodiment of the invention.
Figure 4C:
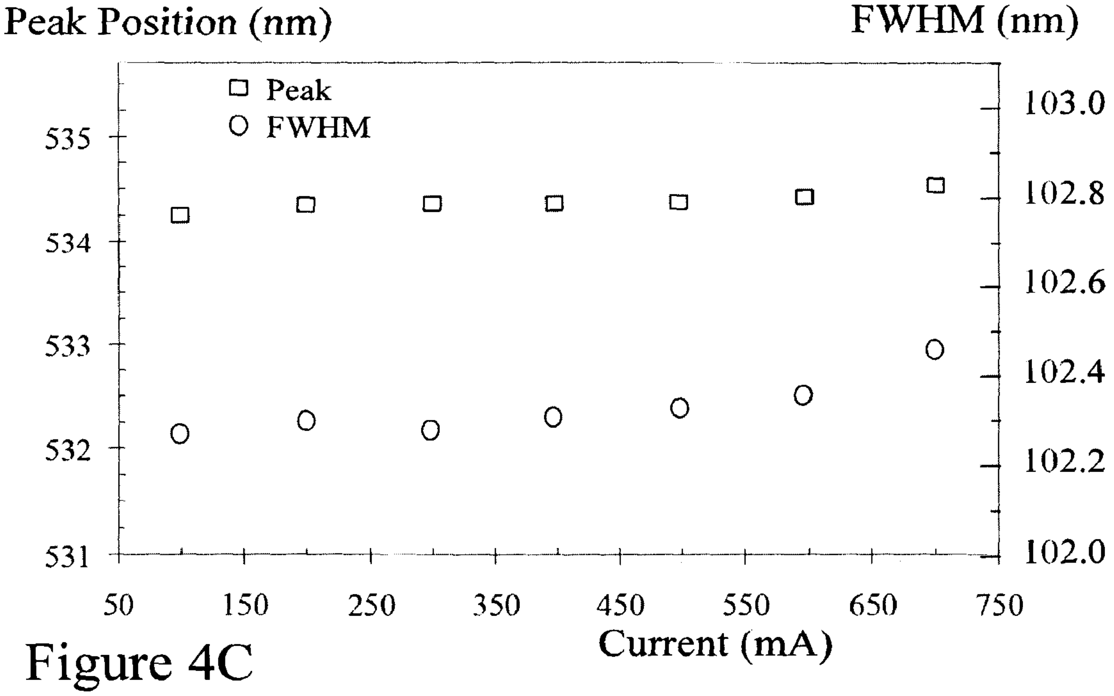
FIG. 4C depicts plots of the peak emission wavelength and spectral linewidth as a function of injection current for InGaN/GaN/AlGaN core-shell dot-in-a-wire LED nanowire LEDs according to an embodiment of the invention.

During initial testing of core-shell dot-in-a-wire LED devices according to embodiments of the invention in order to minimize junction heating effect the devices were first measured under pulsed biasing conditions. An example of the measured output spectra under various injection currents are shown in FIG. 4A under 1% duty cycle. It is seen that the spectra are highly stable and nearly independent of injection current. This stable emission characteristic with increasing current is further illustrated in the CIE diagram of FIG. 4B wherein the derived x and y values are in the ranges of ~0.35-0.36 and ~0.39-0.40 respectively over all injection currents. This stable emission is attributed to the large inhomogeneous broadening of the quantum dots and the enhanced hole transport arising from the p-type modulation doping. The measured variations in leak emission wavelength and spectral linewidth are further illustrated in FIG. 4C. From this Figure it can be seen that the peak wavelength position shift is less than 1 nm, and the spectral linewidth variation is less than 0.3 nm. Such extremely stable emission has not been possible in conventional prior art quantum well LEDs due to the strong polarization fields and the associated quantum-confined Stark effect.

Figure 4D:
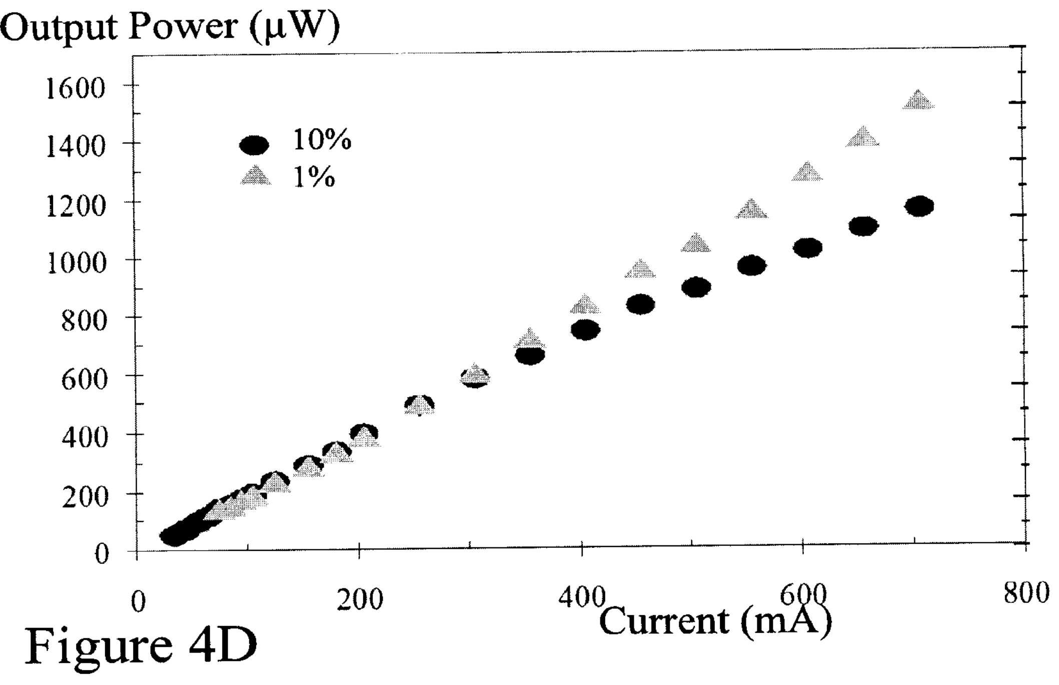
FIG. 4D depicts output power versus injection current for core-shell dot-in-a-wire LED nanowire LEDs according to embodiments of the invention under 1% and 10% duty cycles.
Figure 4E:
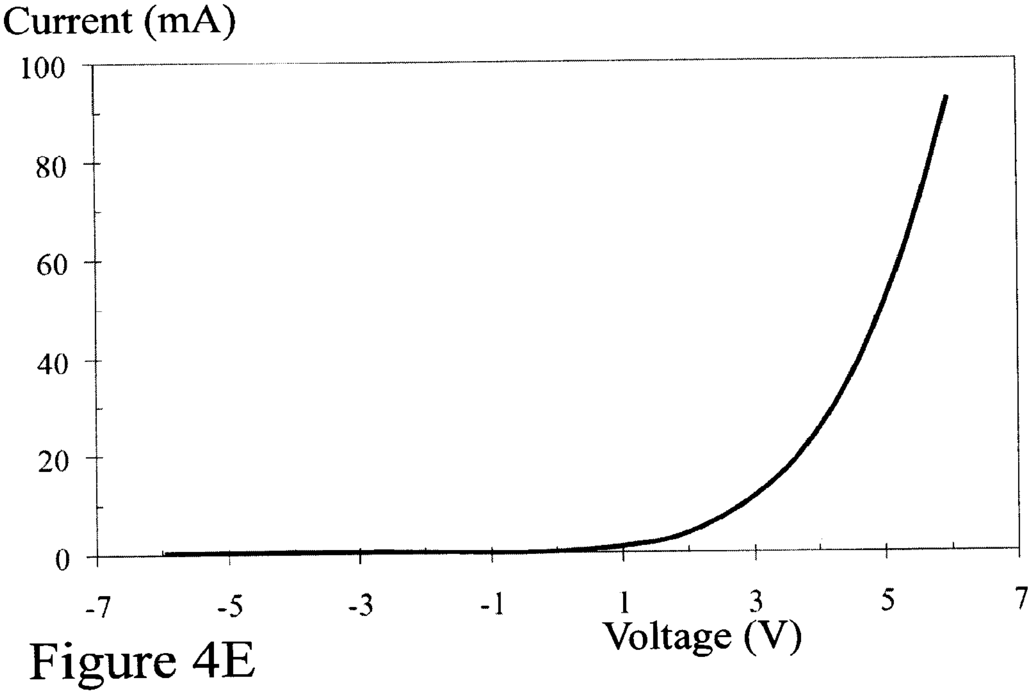
FIG. 4E depicts current versus voltage characteristics of a core-shell dot-in-a-wire LED white LED according to an embodiment of the invention.

Significantly, these devices exhibit relatively high output power. As evident from FIG. 4D the output power increases monotonically with current and an output power of ~1.5 mW is measured for an injection current of ~700 mA at 1% duty cycle. For comparison, if the output power of prior art nanowire LEDs without the AlGaN shell was also plotted it would approximately ~1,000 times smaller than that of the core-shell dot-in-a-wire LEDs. The significantly improved output power is attributed to the increased electrical injection efficiency, arising as a result of the effective carrier confinement offered by the shell structure and the reduced surface recombination. To the inventor's knowledge, this is the highest power ever reported for any nanowire LED. The inventors have further studied the effect of junction heating on the nanowire LED device performance. As depicted in FIG. 4D when operated under a high duty cycle, 10%, there is a small reduction in the output power of the core-shell dot-in-a-wire nanowire LED according to an embodiment of the invention, due to the thermal effect, which can be effectively addressed by using proper packaging and thermal management. It is also important to note that the core-shell dot-in-a-wire nanowire LEDs exhibit excellent current-voltage characteristics, as depicted in FIG. 4E, with a turn-on voltage of ~2.2 V and virtually no leakage current under reverse bias.

Importantly, the colour rendering index of the dot-in-a-wire core-shell dot-in-a-wire LED s according to embodiments of the invention can be engineered by varying the dot emission properties at the wafer-level during manufacturing. With prior art phosphor-based LED lamps these generally exhibit a relatively low colour rendering index (CRI), typically CRI <85, and there is often a trade-off between the luminous efficacy and the colour rendering quality of the LED light source. The CRI is a quantitative measure of the ability of a light source to reproduce the colors of various objects faithfully in comparison with an ideal or natural light source. Further, the CRI of conventional white LED lamps varies over time, primarily due to the instability of the phosphor coating employed. However, the inventors have, by optimizing the In content within the InGaN/GaN quantum dot active region, achieved CRI values in the range of 90 to 98, which is believed to be the highest achieved to date for any LED lamp.

Figure 5A:
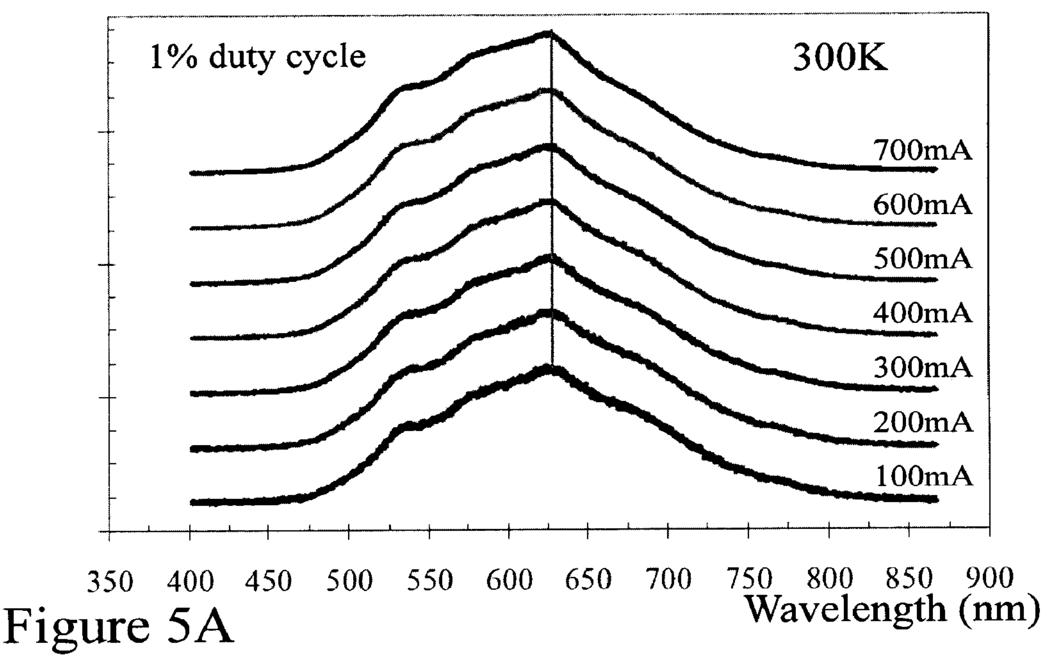
FIG. 5A depicts electroluminescence spectra of a core-shell dot-in-a-wire LED according to an embodiment of the invention exhibiting broad spectral linewidth and CRI of 95.
Figure 5B:
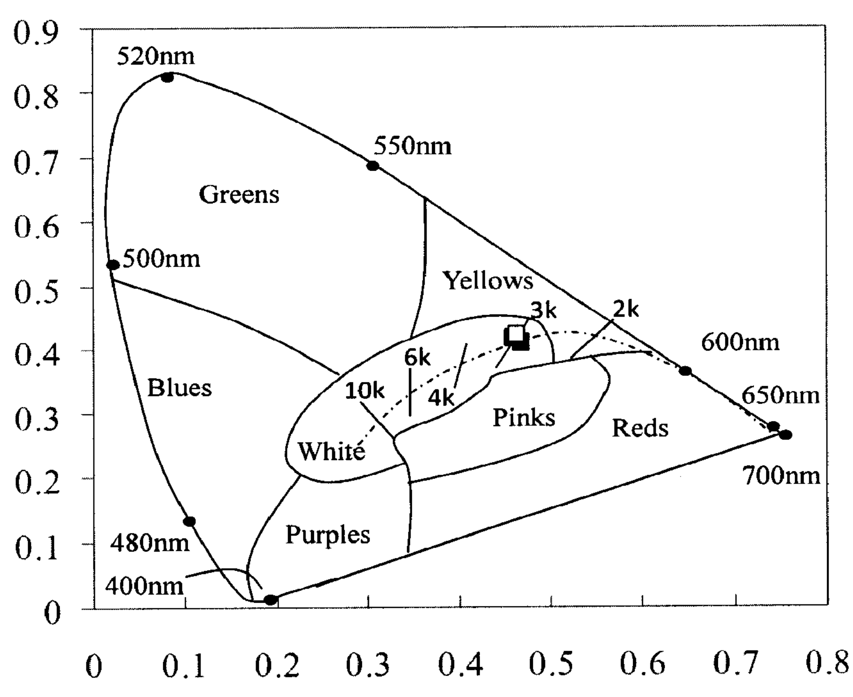
FIG. 5B depicts the CIE diagram showing stable white light emission from the same core-shell dot-in-a-wire LED according to an embodiment of the invention.

Referring to FIG. 5A there is depicted the electroluminescence spectra of a representative InGaN/GaN/AlGaN dot-in-a-wire core-shell dot-in-a-wire LED according to an embodiment of the invention which exhibits broad spectral linewidth (~170 nm) and covers the entire visible wavelength range. The stability of the emission spectra is further confirmed by the results shown in the CIE diagram presented in FIG. 5B with varying drive current. The determined x and y values being within the ranges of $0.457 \leq x \leq 0.466$ and $0.414 \leq y \leq 0.417$, respectively.

Accordingly, the inventors have shown that poor electrical injection efficiency, due to the presence of surface states/defects, represents one of the major bottlenecks for achieving high efficiency and high power nanowire LED lamps. Exploiting dot-in-a-wire core-shell based LED structures according to embodiments of the invention the inventors have demonstrated devices that largely address this critical issue Devices according to embodiments of the invention exhibit relatively high output power (>1.5 mW) at room temperature, which can be further improved by optimizing the light extraction efficiency. Moreover, the phosphor-free core-shell dot-in-a-wire nanowire white LEDs can exhibit unprecedentedly high colour rendering index, compared to prior art phosphor-based LED lighting technology.

C. Selective Core-Shell Dot-In-Wire Placement and Activation

Figure 1D:
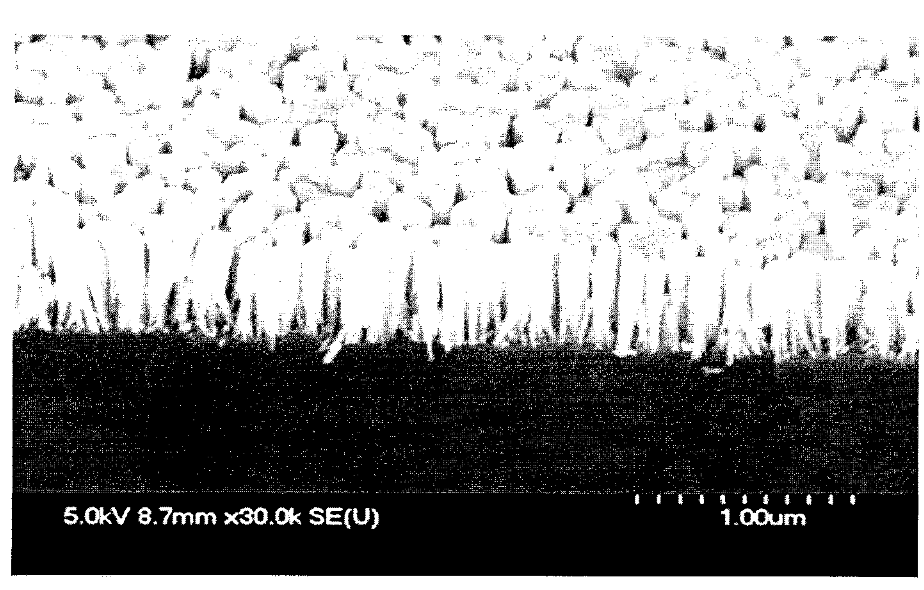
FIG. 1D depicts a 45° tilted SEM image of a typical InGaN/GaN/AlGaN core-shell LED structure according to an embodiment of the invention.
Figure 7:
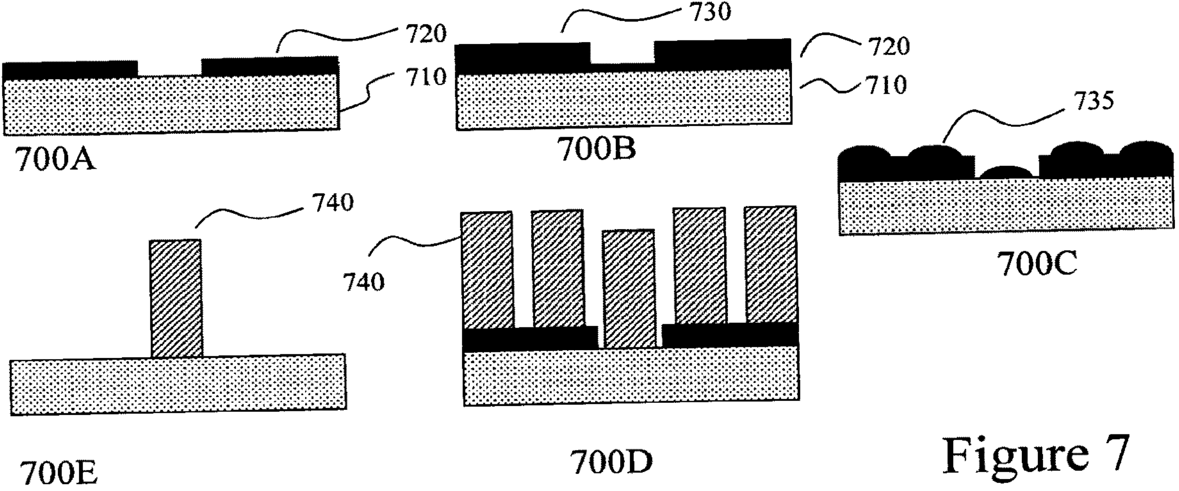
FIG. 7 depicts an exemplary process for growing core-shell dot-in-a-wire nanowire LEDs according to an embodiment of the invention at predetermined locations upon a substrate.

Within the descriptions supra in respect of FIG. 1 through 6 the AlGaN shell was described as being ~70 nm thick on the top and ~8 nm on the sides due to the density of the nanowires on the substrate, as evident in FIG. 1D. Referring to FIG. 7 there is shown an embodiment of the invention for providing nanowires at predetermined locations upon a substrate 710. In first step 700A the substrate 710 has patterned a buffer material 720 that has been patterned with apertures where it is intended for nanowires to be formed. The buffer material should be capable of withstanding in situ oxide desorption at elevated temperatures (~770° C.). Next at step 700B the substrate 710 and buffer material 720 are shown at an early stage within the growth process wherein an organometallic precursor for a group III element, for example trimethylindium (TMIn) or trimethylgallium (TMGa), is introduced without nitrogen forming an initial thin layer. As the thickness increases the group III element, e g. In or Ga, nucleates and forms liquid droplets 735 as shown in step 700C. The process continues as shown in step 700D with the introduction of the second precursor, ammonia, such that the group III nitride, e.g. InN or GaN, growth occurs and the nanowires 740 are formed where the liquid droplets 735 existed as the thickness increases. The growth process is then terminated after the predetermined period of time such that the group III nitride nanowires 740 are the required height. Subsequently the wafer is removed from the growth reactor and the buffer layer 720 is removed leaving free standing nanowires 740 where the openings within the buffer layer 720 existed.

Figures 8, 9:
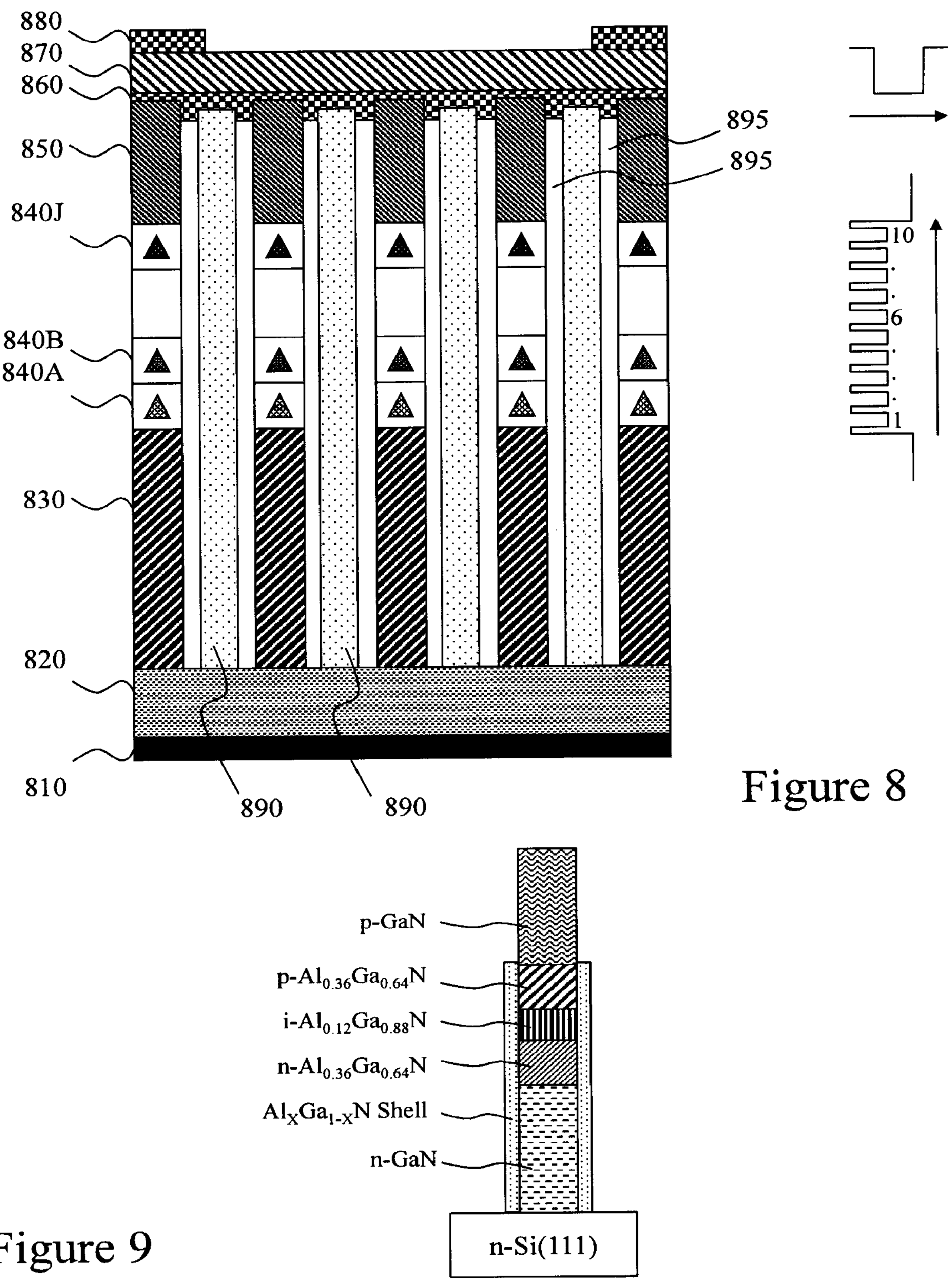
FIG. 8 depicts a schematic construction of a dot-in-a-wire white light LED source according to an embodiment of the invention.
FIG. 9 depicts a schematic of an AlGaN DH nanowire with shell structure LED according to an embodiment of the invention.

Referring to FIG. 8 there is depicted a self-organized InGaN/GaN dot-in-a-wire LED light source grown on a low resistivity n-type Si(11) substrate 820. The bottom n-type Si doped GaN 830 is formed atop this, followed by the ten quantum dots 840A through 840J, and then the upper p-type Mg doped GaN 850 Providing the electrical contacts are lower Ti/Au contact 810 and upper Ni/Au contacts 860 and 880 that are separated by an indium tin oxide (ITO) 870 The nanowires have AlGaN shells 895 and are separated by polyimide 890. As shown the device active region consists of ten vertically aligned InGaN quantum dots, 840A, 840B, to 840J separated by GaN barrier layers, typically approximately 3 nm thick. The flat energy band diagrams along the nanowire axial direction and along the lateral direction of the quantum dot active region are also illustrated in FIG. 8. Due to In segregation, the GaN barrier layers also contain a small percentage (~5-10%) of In.

The resulting thin, approximately 3 nm, InGaN barrier layers can enhance the hole injection and transport in the quantum dot active region, thereby leading to more uniform hole distribution, reduced electron leakage, and enhanced internal quantum efficiency at relatively high current levels. Optionally, to further enhance the hole transport the structure is modulation doped p-type, which is achieved by incorporating Mg in part of the GaN barrier layer, with the Mg effusion cell temperature at approximately 150° C. to approximately 200° C. This technique of modulation p-doping being shown by the inventors to reduce deleterious effects associated with the direct Mg incorporation in the quantum dots. As a consequence, no degradation in the optical properties of the p-doped dot-in-a-wire heterostructures was measured, compared to the undoped LED device heterostructures.

During the device fabrication process, the InGaN/GaN nanowire arrays were first planarized using a polyimide 890 resist layer by spin-coating, which was followed by an appropriate dry etching process to reveal the top GaN:Mg 850 sections of the dot-in-a-wire heterostructures. The p-metal and n-metal contacts, consisting of Ni (approximately 5 nm)/Au (approximately 7 nm)/indium tin oxide (ITO) 860 and Ti/Au 810 layers, were then deposited on the exposed wire surface and the backside of the Si substrate 820, respectively. The fabricated devices with Ni/Au 860 and Ti/Au 810 metal contacts were first annealed at approximately 500° C. for 1 minute in nitrogen ambient. Upon deposition of the ITO transparent contact, a second annealing step was performed at approximately 300° C. in vacuum for approximately 1 hour. It would be evident that patterning of the electrical contacts provides for selective activation of regions of the core-shell dot-in-a-wire light source.

D. Ultraviolet Core-Shell Dot-in-a-Wire Light Emitters

Within the preceding Section B the focus was to visible LEDs exploiting InGaN/GaN/AlGaN core-shell dot-in-a-wire LED heterostructures to provide phosphor-free InGaN/GaN nanowire white LEDs according to embodiments of the invention. However, by varying the Al composition, the emission from $Al_xGa_{1-x}N$ ternary alloys can cover the entire ultraviolet UV A-C range, namely from approximately 100 nm to approximately 400 nm. UV optoelectronic devices offer enormous potential within applications for biosensors and medical devices. For example, efficient, spectrally pure UV emission at 340 nm is important for the optical determination of the reduced nicotinamide adenine dinucleotide (NADH), a key constituent molecule found in all living cells, that has a strong absorbance at 340 nm and a fluorescence emission peak at approximately 460 nm, see for example Davitt et al (Opt. Express, Vol. 13, pp. 9548-9555), Xu et al (J. Phys. D: Appl. Phys. 41 094013), and Peng et al (Appl. Phys. Lett. 85, pp. 1436-1438). Accordingly, a compact efficient 340 nm optoelectronic excitation source is desired to be integrated into a nanobiosensor for disease diagnosis via NADH fluorescence testing, see for example Mayevsky et al (Am. J. Physiol., 292, C615-40) and Koo et al (Nanobiosens. Dis. Diag., 1, 5-15). In addition, a biocompatible implantable UV light source represents one of the key components of future medical devices to optically control neurons and/or to perform photolysis of photolabile caged compounds such as neurotransmitters, nucleotides, Ca2+ chelators, y-aminobutyric acid (GABA) and fluorescent dyes, see for example Miller (Science, 314, pp. 1674-16766) and Rothman et al (Epilepsy Res., 74, pp. 201-209). In most of these applications UV emission below 340 nm is normally not desirable, as it leads to concerns about deep UV light induced toxicity, see for example Rothman, Chang et al (J Physiol., 524, pp. 365-274), and Leskiewicz et al (J. Physiol., 536, pp. 471-478). Accordingly, it would be beneficial to provide compact UV LEDs for such applications.

As noted supra nanowire LEDs can offer high efficiency and provide flexible device sizes ranging from a single nanowire to a nanowire array. Moreover, nanowires can act as direct waveguides and lead to high efficiency light emission without sophisticated packaging and extra optical elements. Within the prior art nanowire UV LEDs generally involve the use of ZnO, or ZnO/GaN heterostructures, see for example Zhang et al (Adv Mater, 21, pp. 2767-2770) and Bie et al (Adv. Mater., 22, pp. 4284-4287). However, these exhibit a very high operation voltage, an unacceptably large resistance (1000Ω or larger), and an uncontrolled emission wavelength, due to the unstable p-type ZnO, the lack of carrier confinement, and the interfacial defects between ZnO and GaN.

D1: Growth and Structural Characteristics. A schematic diagram of the $Al_xGa_{1-x}N$ nanowire is depicted in FIG. 9. The LED structure was grown on n-Si (111) using a molecular beam epitaxy (MBE) system equipped with a radio-frequency plasma-assisted nitrogen source. Before growth initiation, a thin (~0.6 nm) Ga seeding layer was firstly deposited according to the invention by the inventors discussed supra. Approximately 200 nm vertically aligned GaN nanowires with Si doping were spontaneously formed from the Ga seedling layer on the Si(111) under nitrogen-rich conditions at 750-800° C. This was followed by the deposition of approximately 100 nm $Al_{0.36}Ga_{0.64}N$:Si nanowire segments as an n-type cladding layer. After that, 40 nm $Al_{12}Ga_{0.88}N$ was grown as the active region and then a Mg doped $Al_{0.36}Ga_{0.64}N$ p-type cladding layer with a height of 100 nm was deposited. Finally, a 30 nm GaN layer doped with Mg was used as a contact layer. During growth, the nitrogen flow rate and plasma forward power were kept at 1 standard cubic centimeter per minute (SCCM) and 350 W, respectively. The growth rates of GaN and $Al_xGa_{1-x}N$ nanowires were approximately 3 nm $min^{-1}$ and 2.5 nm $min^{-1}$ respectively. During the growth of the active region and cladding layers, the Al composition (x) was varied by controlling the Al/Ga flux ratios.

The sample morphology was examined by a high resolution scanning electron microscope (SEM). As shown in FIG. 10, the nanowires are vertically aligned on the substrate with excellent uniformity. The nanowire density is estimated to be $1\text{-}10^{\prime 0}$ $cm^{-2}$. Subsequently, a scanning transmission electron microscope (STEM) was used for annular dark field imaging and energy dispersive x-ray spectrometry (EDXS) analysis. Referring to FIG. 11 there is depicted a high angle annular dark field (HIAADF)-STEM image 1100 which is sensitive to the atomic number of the imaged material. The bright contrast regions at the bottom and top of the nanowire correspond to the GaN nanowire template and the p-type GaN contact regions, respectively. Additionally, the p- and n-type $Al_{0.36}Ga_{0.64}N$ cladding layers, and the intrinsic $Al_{0.12}Ga_{0.88}N$ active region can be identified based on the detailed studies described below Insert image 1150 is a high resolution-TEM (HR-TEM) image of the edge of the active region showing the shell formed around the sidewall of the nanowire.

Figures 12A, 12B, 12C:
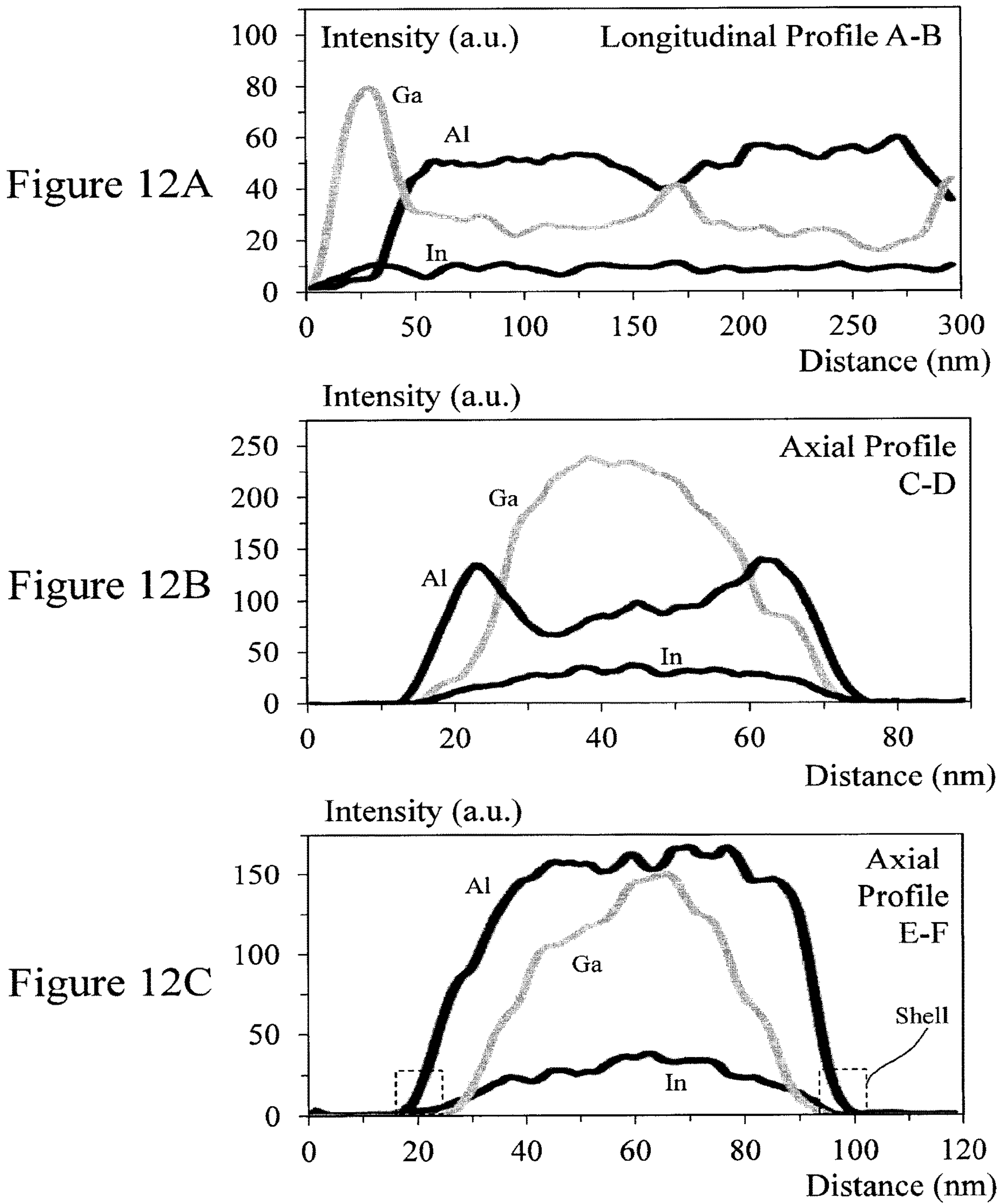
FIGS. 12A to 12C depict element profiles for a typical AlGaN DH nanowire with shell structure LED according to an embodiment of the invention.

Referring to FIGS. 12A to 12C there are depicted the resulting measured elemental profiles. FIG. 12A depicts the elemental profiles along the nanowire axial direction derived from EDXS line scanning analysis along the growth direction (line A-B in FIG. 11). As can be observed, in the top region of the nanowire, only Ga and N signals are presented, indicating the existence of a p-type GaN layer Below the thin p-type GaN region, the rapid increase of the Al signal and the decrease of the Ga signal prove the formation of the $Al_xGa_{1-x}N$ cladding layer with a relatively high Al composition Between the two cladding layers, an Al signal with a clear dip and a Ga signal with a peak can be observed, providing unambiguous evidence for the existence of a DH configuration along the nanowire axial direction.

It should be highlighted that, during the growth of the $Al_xGa_{1-x}N$ nanowire under nitrogen-rich conditions, a large amount of Al adatoms accumulate near the sidewall of the nanowire, due to a relatively short adatom diffusion length, resulting in the formation of an Al-rich $Al_xGa_{1-x}N$ shell on the nanowire lateral surfaces, see for example Wang et al (Appl. Phys. Lett, 101, 043115), Allah et al (Appl. Phys. Express, 5, 045002), Jindal et al (J Appl. Phys, 105, 084902), Shitara et al (Appl. Phys. Lett., 62, pp. 1658-1660), and Songmuang et al (Nanotechnology, 21, 295605). It has been confirmed that the formation of such an Al-rich shell structure can effectively suppress non-radiative recombination on the lateral surfaces of the active region and thus significantly improve the quantum efficiency. Shown in FIG. 12B, a clear contrast between the bright inner core compared to the dark outer shell is observed, indicating the formation of a thin $Al_xGa_{1-x}N$ shell layer with higher Al composition in the radial direction around the sidewall of the nanowire Due to the spontaneous formation of the AlGaN shell as well as the contribution to the shell from the subsequently grown AlGaN, the shell thickness is gradually varied from about 15 nm to a few nm with increasing height from the bottom GaN template to the top region of the nanowire. The presence of an Al-rich shell region may also be clearly observed from the high resolution TEM image taken at the edge of the $Al_{0.12}Ga_{0.88}N$ active region, insert image 1150 in FIG. 11. Its thickness is determined to be approximately 5 nm and is formed during the growth of the p-doped and undoped AlGaN layers. EDXS analyses were further performed to investigate the radial atomic distribution of the nanowire. The electron beam diameter is approximately 0.2 nm. The EDXS scanning lines and corresponding elemental profiles along the lateral direction of the bottom GaN template (line C-D in FIG. 11) an active region (line E-F in FIG. 11) are shown in FIGS. 12B and 2C respectively. It is evident in FIG. 12C across the GaN template region, the Al signals show a clear dip in the core region accompanied by two shoulders confirming the existence of an Al-rich shell.

Around the $Al_{0.12}Ga_{0.88}N$ active region, shown in FIG. 12C, the increase of the Al signal is also much faster than that of the Ga signal in the near-surface region of the nanowire, highlighted by the black boxes in FIG. 12C. The less obvious shoulder feature measured in the active region (FIG. 12C), compared to that of the GaN nanowire template (FIG. 12B), is due to the relatively smaller shell thickness and lower Al compositional contrast between the core and shell of the active region.

D2: Photoluminescence and Internal Quantum Efficiency. Optical properties of the nanowire LED were investigated using temperature and power variable photoluminescence (PL) spectroscopy. A 266 nm diode-pumped solid-state (DPSS) Q-switched laser was used as the excitation power source. The duration, maximum energy, and repetition rate of the laser pulse were approximately 7 ns, 4 μJ, and 7.5 kHz, respectively. The signal was collected and analyzed by a high resolution spectrometer and detected by a photomultiplier tube. In order to perform power dependent photoluminescence (PL), the excitation power was reduced using UV neutral density filters A long pass filter ($\lambda$>270 nm) was placed in front of the spectrometer to eliminate emission from the excitation laser source. In temperature dependent PL measurements, the samples were placed into a helium closed-loop cryostat with temperature varying from 20 K to room temperature.

Figures 13, 14:
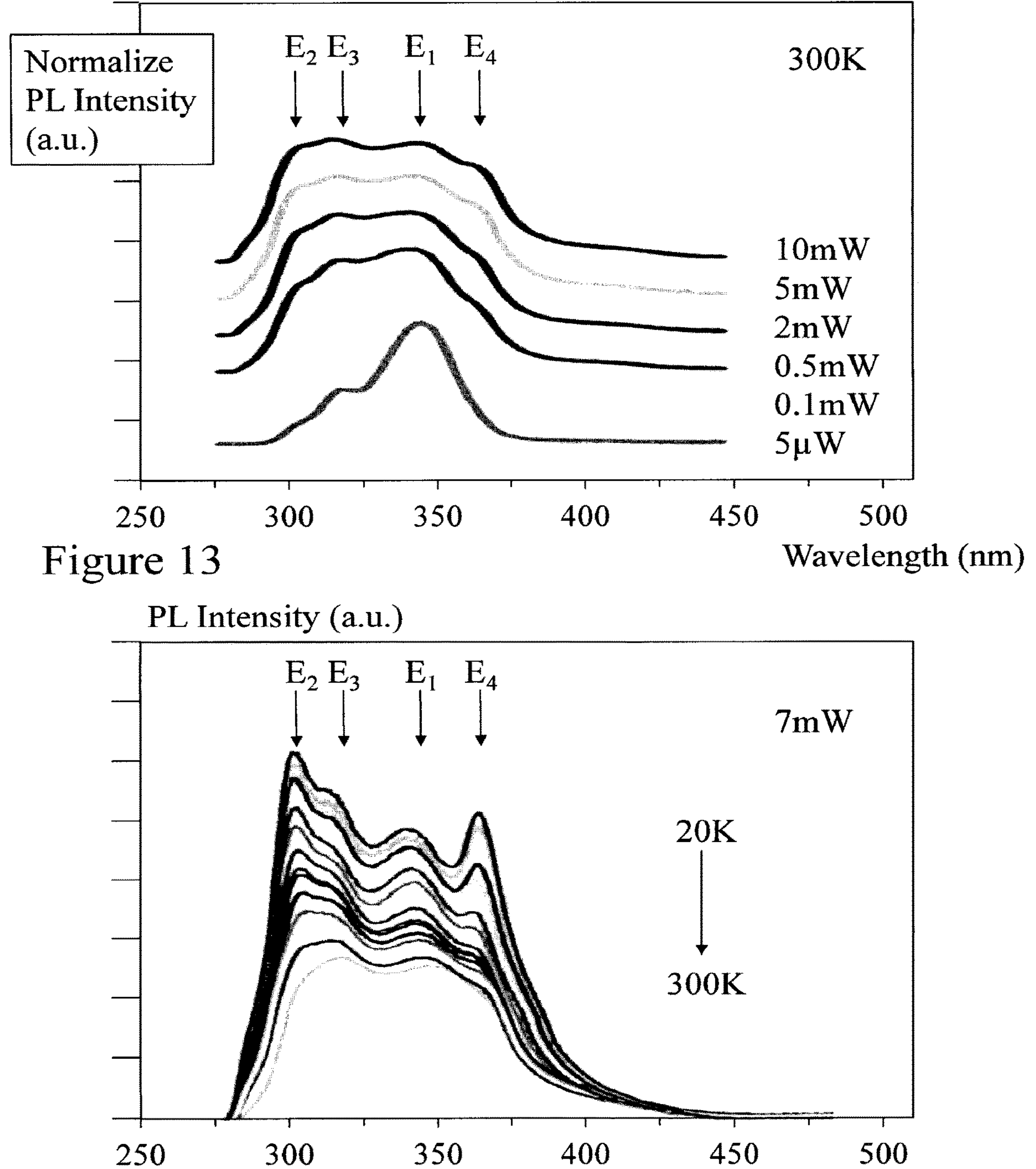
FIG. 13 depicts excitation power dependent photoluminescence spectra at room temperature for AlGaN DH nanowires with shell structure LEDs according to an embodiment of the invention.
FIG. 14 depicts temperature dependent photoluminescence spectra at 7 mW for AlGaN DH nanowire with shell structure LEDs according to an embodiment of the invention.

FIG. 13 shows the normalized power dependent PL spectra measured at room temperature. At a very low excitation power, i.e., at 5 μW. PL emission from the $Al_{0.12}Ga_{0.88}N$ active region with a peak at 340 nm (E1) dominates, which is attributed to effective carrier confinement in the active region. Moreover, two extra shoulders appear at ~295 nm (E2) and 310 nm (E3), respectively. The E3 peak corresponds to $Al_{0.36}Ga_{0.64}N$ cladding layers with higher Al compositions and the E3 peak is most likely due to the defect associated radiative recombination in doped $Al_xGa_{1-x}N$ Such sub-band parasitic emission is often observed in $Al_xGa_{1-x}N$ multiple quantum well (MQW) based deep UV LEDs, see for example Zhang et al (Appl. Phys. Lett, 83, pp. 3456-3458), Zhou et al (Appl. Phys Lett, 89, pp. 241113) and Zhang et al (Appl. Phys Lett., 93, 131117). With increasing excitation power, the PL emission from the active region (E1) begins to saturate, while the emission from the cladding layers (E2 and E3) is increased rapidly. This is mainly due to the fact that at high excitation power, photo-excited carriers with a higher thermal energy are more likely to escape from the active region and recombine in the cladding layers. Moreover, with increasing excitation power, the cladding layers themselves could also absorb more laser light and thus generate a stronger PL intensity. Finally, the emission at ~364 nm from the GaN segment (E4) can be observed at high excitation power.

We further performed temperature dependent PL studies from 20 to 300 K at an excitation power of 7 mW, shown in FIG. 14. It can be seen that at low temperature (20 K) the emission from the cladding layers (E2 and E3) is stronger than other peaks. This is mainly due to the fact that non-radiative recombination centers are largely inactive at low temperatures (~10-20 K) and, consequently, the influence of non-radiative defects on the optical properties of the cladding layers can be negligible. Moreover, the strong absorption of laser light in the p-type cladding layer on the top of the nanowires and the relatively large material volume also contribute to the strong E2 and E3 peaks. For the same reasons, strong PL emission from doped GaN layers (E4) is also present at low temperatures. However, with increasing temperature, the enhanced non-radiative recombination leads to a faster decrease of the E2, E3 and E4 peaks due to higher Al compositions and/or doping induced defects in the cladding and GaN layers. In comparison, the reduction in the PL intensity of the E1 peak from the intrinsic active region with higher crystal quality and better carrier confinement is much smaller with the increase of temperature from 20 and 300 K.

Figures 15, 16:
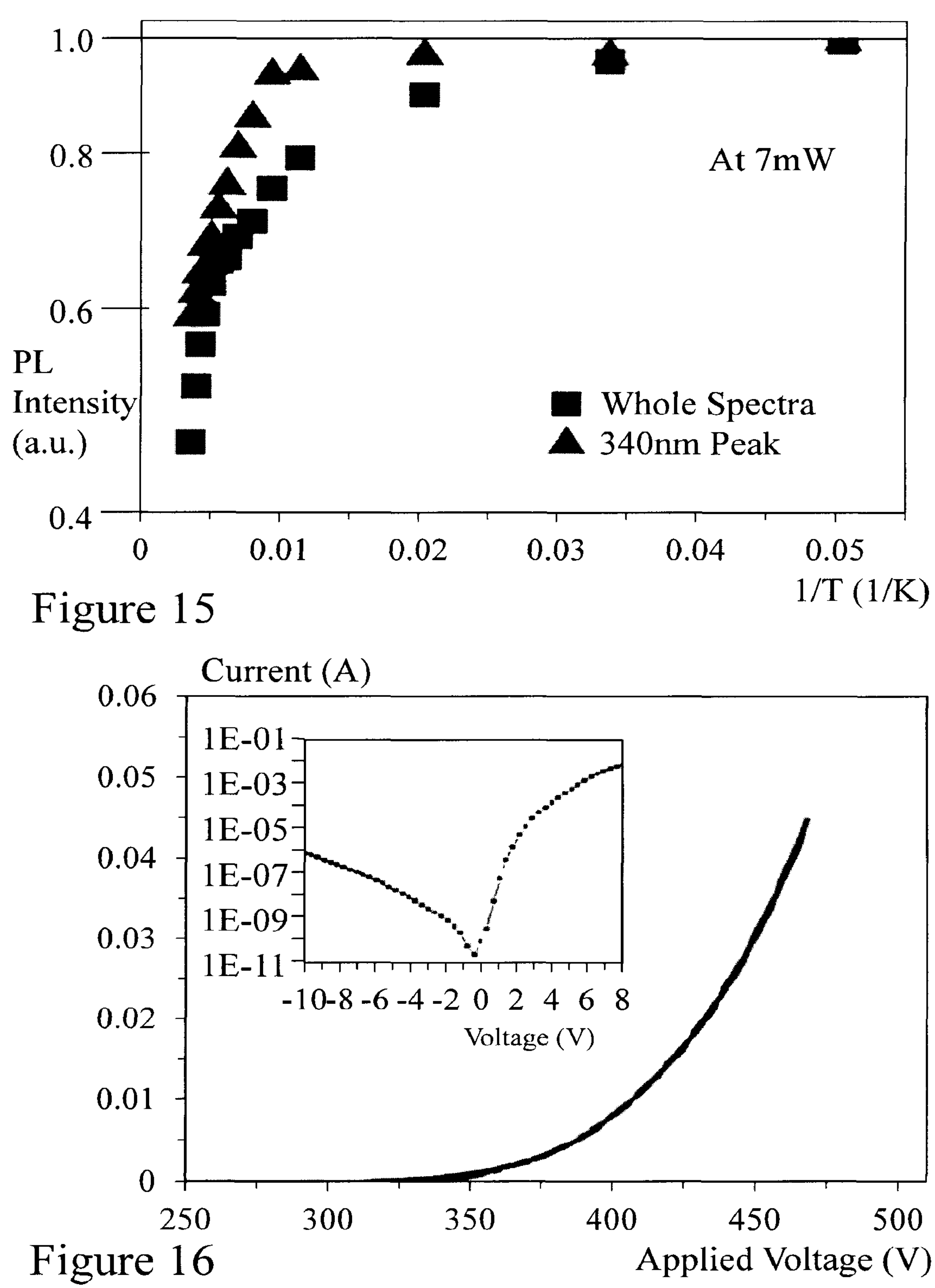
FIG. 15 depicts an Arrhenius plot of the temperature dependent photoluminescence spectra at 7 mW for AlGaN DH nanowire with shell structure LEDs according to an embodiment of the invention.
FIG. 16 depicts a typical I-V curve for AlGaN DH nanowire with shell structure LEDs according to an embodiment of the invention.

The IQE can be approximately estimated by comparing the integrated PL intensity measured at room temperature with respect to that measured at low temperature. FIG. 15 shows the normalized integrated PL intensities of the whole spectra as a function of temperature in an Arrhenius plot. It is seen that at 7 mW excitation power the PL intensity at room temperature remains at about 46% of its intensity at 20 K, which is comparable to the previously reported IQE values for $Al_xGa_{1-x}N$ ternary nanowires measured under similar conditions, see Wang. The IQE of the active region at room temperature is further estimated based on the peak intensity at 340 nm at 7 mW excitation power. Shown in FIG. 15 the E1 peak intensity at room temperature remains at about 59% of its intensity at 20 K. The resulting IQE of ~59% is higher than that of the undoped $Al_xGa_{1-x}N$ nanowire measured under similar conditions. The enhancement in the IQE is mainly attributed to the effective carrier confinement of the active region in both the vertical and radial directions provided by the cladding layers and the unique shell structure, respectively.

D3: Device Fabrication and Characteristics. The fabrication of $Al_xGa_{1-x}N$ nanowire array based LEDs was carried out with a polyimide resist layer being used for the planarization and passivation of the nanowires, see for example Nguyen et al (Nano Lett. 11, pp 1919-1924). An appropriate etch-back process using reactive ion etching was performed in order to allow for the exposure of the p-type layer of the nanowires. Before the deposition of the p-type metal contact, 49% HCl was used to remove any oxidized layer on the $p^-$-type GaN layer for 1 min, After that, a Ni(7.5 nm) Au(7.5 nm) bi-layer was deposited at below $10^{-7}$ Torr by an electron beam evaporator and then annealed at 550° C. in $N_2$ for 1 min using a rapid thermal annealing (RTA) system. The n-type metal contact Ti(20 nm)/Au(100 nm) was deposited at the backside of the n-type Si substrate and also annealed at 550° C. for 1 min via RTA. Finally, metallic contact grids with Ti(20 nm)/Au(150 nm) were made on the device surface to facilitate the carrier transport and injection process Devices fabricated in different batches have been tested, and they exhibited similar I-V characteristics, demonstrating reliable device fabrication.

Referring to FIG. 16 there is depicted a typical I-V curve for nanowire based UV LEDs according to an embodiment of the invention with an area of 300 μm×300 μm. It exhibits excellent diode characteristics under forward bias, with 6.3 V at 20 mA injection current. The series resistance is estimated as approximately 50K Such results are significantly better than other nanowire based LEDs in the near UV region, see for example Zhang and Bie, and are also comparable with $Al_xGa_{1-x}N$ MQW based LEDs with the same peak emission wavelength, see for example Peng, Wang et al (Appl. Phys. Lett., 89, 081126), Oder et al (Appl. Phys. Lett., 84, pp. 466-8), Kim et al (Appl. Phys. Lett, 83, pp. 56-8), Jeon et al (Appl. Phys Lett., 43, L1409), and Smith et al (Appl. Phys. Lett., 95, 8247-8251). Achieving such good electrical properties for nanowire based LEDs can be partly attributed to the enhanced conductivity in III-nitride nanowires, due to the significant reduction in the formation energy for substitutional doping in the near-surface region of nanowires, see for example Zhao et al (Nano. Let. 12, pp. 2877-2882). Also shown in the inset of FIG. 16 the leakage current under a reverse bias of −10V is ≈4×$10^{-6}$ A, which is slightly higher in comparison with the planar LEDs, see for example Wang (Appl. Phys. Lett., 41, 094003), In the case of nanowire LEDs, insufficient insulation of polyimide resist between the nanowires could be a major source of leakage paths, thereby leading to a relatively high leakage current for the nanowire LEDs. Moreover, carriers recombining in the active region via surface states on the nanowire sidewall also contribute to the measured leakage current, see for example Bai et al (J. Appl. Phys., 111, 113103) and Lee et al (IEEE J. Set. Top. Quant. Electron., 17, pp. 985-989). With improved utilization of filling materials with high resistance and better sidewall passivation schemes this leakage current can be reduced further by removing such shorting paths along the nanowires.

Figures 17, 18:
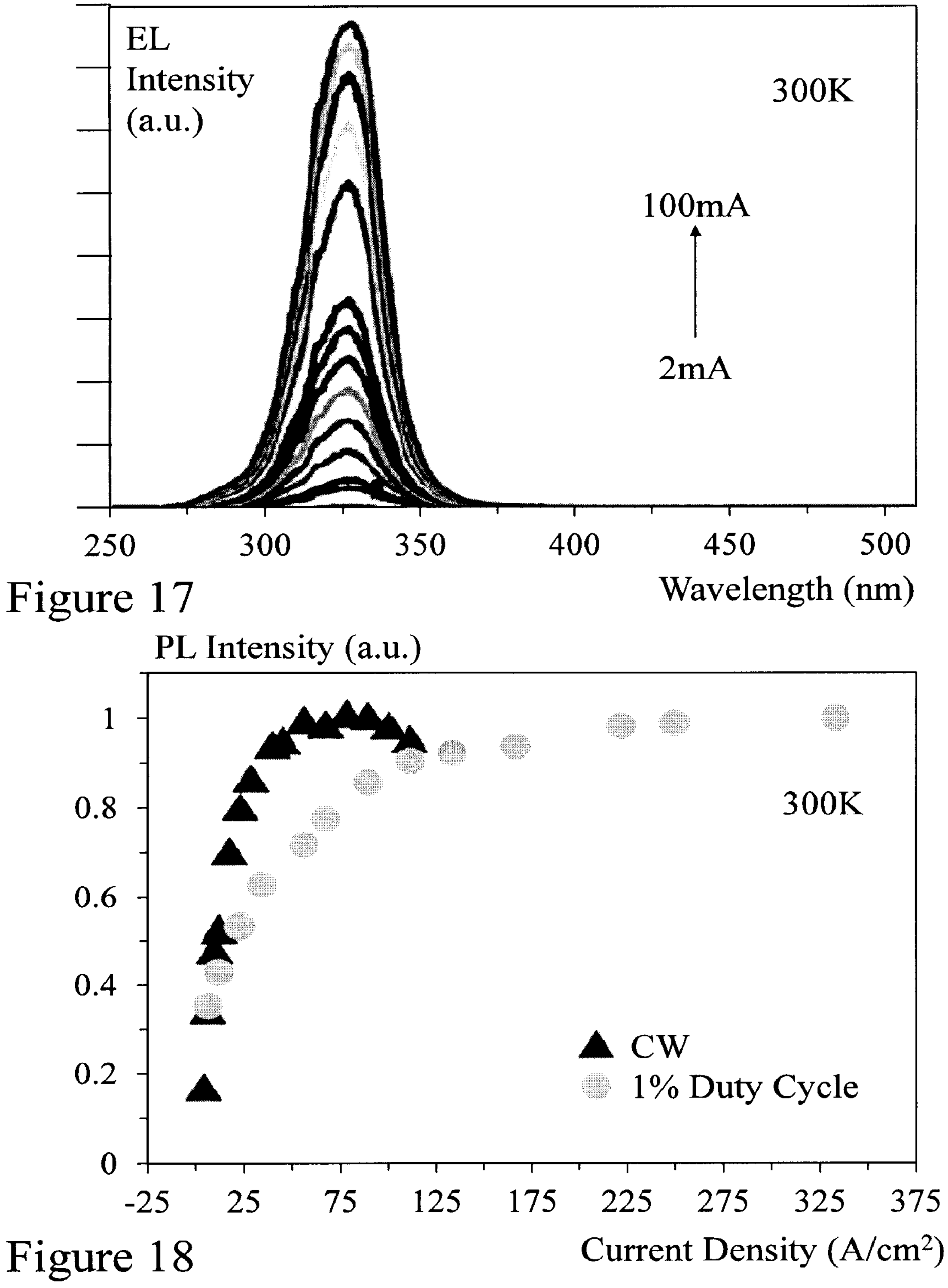
FIG. 17 depicts electroluminescence spectra for AlGaN DH nanowire with shell structure LEDs according to an embodiment of the invention at room temperature with varying injection current.
FIG. 18 depicts the relative external quantum efficiencies for AlGaN DH nanowire with shell structure LEDs according to an embodiment of the invention under CW and pulse injection.

Now referring to FIG. 17 there is depicted a typical EL spectra at room temperature with different injection currents from 2 to 100 mA under continuous wave (CW) biasing conditions Devices tested from different areas of the wafer showed similar EL spectra, indicating good uniformity over the 2 inch (50 mm) wafer. It can be seen that the device exhibits a strong and stable emission at 340 nm with the absence of any emission in the visible wavelength range, which was observed in $Al_xGa_{1-x}N$ MQW based UV LEDs, due to the deep level defects in $Al_xGa_{1-x}N$, see for example Zhang, Chen et al (J. Appl Phys., 101, 113102) and Park et al (J. Appl. Phys., 45, 4083). Such a clean EL spectrum is important in the improvement of the signal-noise ratio and to eliminate the occurrence of fake results in discrimination of the NADH. Moreover, the emission peak position shows very small shifts (<2 nm). With increasing injection current, signifying the presence of a negligible polarization field due to the effective strain relaxation in the lateral direction of nanowires. The full-width-at-half-maximum (FWHM) for EL spectra is ~30 nm and is nearly independent of injection currents.

The relative external quantum efficiency (EQE) is measured under both CW and pulsed mode biasing conditions, as shown in FIG. 18. It is seen that efficiency droop is absent in such nanowire devices under pulsed biasing conditions (1% duty cycle) for injection currents up to ≈350 $Acm^{-2}$ at room temperature. Compared to MQW based LEDs, $Al_xGa_{1-x}N$ nanowire structures can exhibit significantly reduced polarization fields and defect densities. Consequently, mechanisms that are largely responsible for efficiency droop in conventional LEDs, including polarization field and defect assisted Auger recombination, may become insignificant in nanowire LEDs, see for example Nguyen et al (Nano. Lett., 12, 1317-1323). However, the performance of $Al_xGa_{1-x}N$ suffers severely from a self-heating effect, see for example Reed et al (Phys Status Solidi c, 5, 2053-5) and Chitnis et al (Appl Phys. Lett., 81, pp. 3491-3), which leads to efficiency droop under CW driving current, as shown in FIG. 18. The reduced thermal conductivity of nanowires, compared to bulk materials also contributes to the heating effect. The heating effect can be potentially addressed by developing/utilizing suitable passivating materials with higher thermal conductivity in the fabrication of nanowire array based LEDs, see for example Zhou et al (Appl. Phys Lett., 101, 012903) and Li et al (J. Phys. Chem. B, 114, 6825-6829).

E. Gan Nanowire Heterostructures on Silicon Oxide

Within the preceding sections high efficiency visible and ultraviolet nanowire LED devices according to embodiments of the invention have been presented grown upon silicon substrates, a single crystalline substrate. However, it would be beneficial in order to substantially adjust the device fabrication costs, as well as to allow seamless integration with other device components, for such high-quality nanowires, to be grown on amorphous and/or flexible substrates. Accordingly, in this section the inventors outline catalyst-free molecular beam epitaxial (MBE) growth and characterization of GaN nanowire heterostructures on silicon oxide ($SiO_x$).

E1. Experiment Configuration. The GaN nanowires were grown on 2-inch Si (111) substrates by radio-frequency plasma-assisted MBE such as described supra in respect of the visible and ultraviolet LEDs. However, prior to loading into the MBE system, the Si substrates were cleaned by standard solvent solutions, and then coated with 100 nm $SiO_x$ by plasma-enhanced chemical vapour deposition (PECVD), which then served as the amorphous template for the nanowire formation. The growth conditions for the GaN nanowires include a substrate temperature of ≈780° C.-830° C., a Ga flux of $\approx 7\text{-}10^{-8}$ torr, a nitrogen flow rate of ≈0.6-1.4 sccm, and a RF plasma forward power of ≈350 W.

PL measurements were performed on GaN nanowires and InGaN/GaN dot-in-a-wire LEDs by optically exciting them using a 405 nm laser source via 100× objective. The defocused beam size is ≈5 μm. The emitted light, collected through the same 100× objective, was spectrally resolved by a high-resolution spectrometer, and was detected by a liquid $N_2$ cooled CCD camera.

Figure 19:
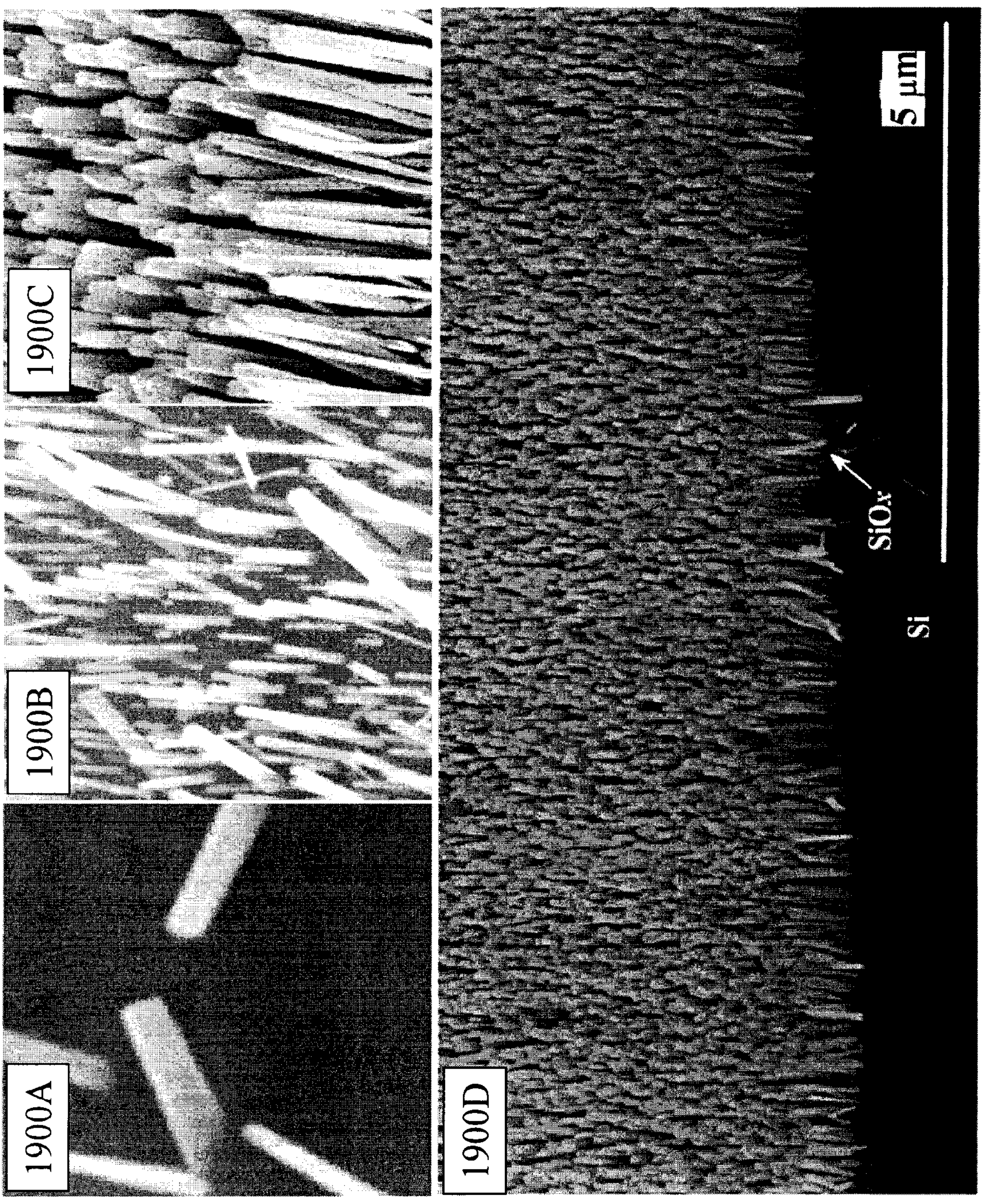
FIG. 19 depicts SEM images of GaN nanowires grown on $SiO_x$ templates under different temperatures according to embodiments of the invention together with a large scale image of the lowest temperature growth.

E2. Results and Discussions. Initially the GaN nanowires grown with different substrate temperatures where the $N_2$ flow rate was kept at ≈1 sccm. An SEM image with a 45-degree angle is shown in FIG. 19 in first to third images 1900A to 1900C which were grown at ≈830° C., ≈808° C., and ≈780° C. respectively. It can be seen that as the substrate temperature decreases, the nanowire density increases dramatically. Meanwhile, the orientation of the nanowires changes from being random/tilted to almost-100% vertically aligned. Moreover, the uniformity (e.g., diameter, length) increases significantly Fourth image 1900D in FIG. 19 clearly demonstrates such highly uniform and vertically aligned GaN nanowires in a large scale, and the 100 nm $SiO_x$, can also be seen as marked. Growth experiments were also performed by changing the $N_2$ flow rate from ≈0.6 sccm to ≈1.4 sccm for a fixed substrate temperature of ≈790° C. In this case, however, no significant change in the nanowire density, orientation, and uniformity was observed.

The temperature dependence of nanowire density/morphology can be understood by the following considerations. At relatively high substrate temperature, the Ga adatom desorption rate is high, therefore the nucleation process is severely suppressed and as a result, the nanowire density is low, see first image 1900A in FIG. 19. In this case, the growth direction/orientation of the GaN nanowires depends strongly on the surface roughness of the underneath $SiO_x$ template, thereby leading to random orientations for such low-density GaN nanowires.

A similar scenario exists for case that the GaN nanowires grow with moderate density when the substrate temperature is decreased, see second image 1900B in FIG. 19. Whilst the presence of vertically aligned GaN is now evident the orientation is still highly dependent on the surface roughness of the underlying $SiO_x$ template. This situation is changed with further decreasing the substrate temperature such that the now much-reduced Ga adatom desorption rate, which in turn enhances the nucleation process, results in GaN nanowires with a very high density ($\approx 10^{10\text{-}11}$ $cm^{-2}$) and with GaN nanowires that are almost 100% vertically aligned, see third image 1900C in FIG. 19. This can be ascribed to, with high nanowire density, the number of Ga adatoms that can impinge onto the non-vertically orientated nanowires is significantly reduced, due to the shadow effect of the surrounding nanowires; as a consequence, the growth of non-vertical nanowires is suppressed, thereby promoting the formation of vertically aligned and nearly uniform GaN nanowire arrays. These results indicate that, besides the role of surface flatness, maintaining a high nanowire density is critical to achieve vertically aligned GaN nanowires on $SiO_x$, and the substrate temperature plays a significant role in the $N_2$-rich conditions. Accordingly, the growth temperature will vary with the amorphous substrate as the group III, e.g. Ga, adatom desorption rate versus temperature will change thereby shifting the temperature at which the nucleation process is enhanced sufficiently to achieve the density of nanowires yielding the shadowing effect and hence vertically aligned nanowire arrays.

This size uniformity and controlled orientation can also be maintained for relatively long GaN nanowires as evident from FIG. 20A which shows an SEM image (taken with a 45-degree angle) of the GaN nanowires grown on $SiO_x$, template at ==780° C. with a $N_2$ flow rate of ≈0.6 sccm for a longer growth duration. It can be seen that the resulting nanowires maintain the high uniformity and vertically aligned orientation FIG. 20B depicts a low-magnification TEM image of a single GaN nanowire with a length of ≈1.8 μm and a diameter of 50 nm and as can be seen, it exhibits a very high uniformity, i.e., equal size in nanowire top and bottom. Further, as evident from FIG. 20A which shows a typical high-resolution TEM image of the root of a single GaN nanowire this exhibits clear atomic planes, and is free of stacking faults. Detailed studies further confirm that the entire nanowire is also free of dislocations.

Figures 21, 22, 23:
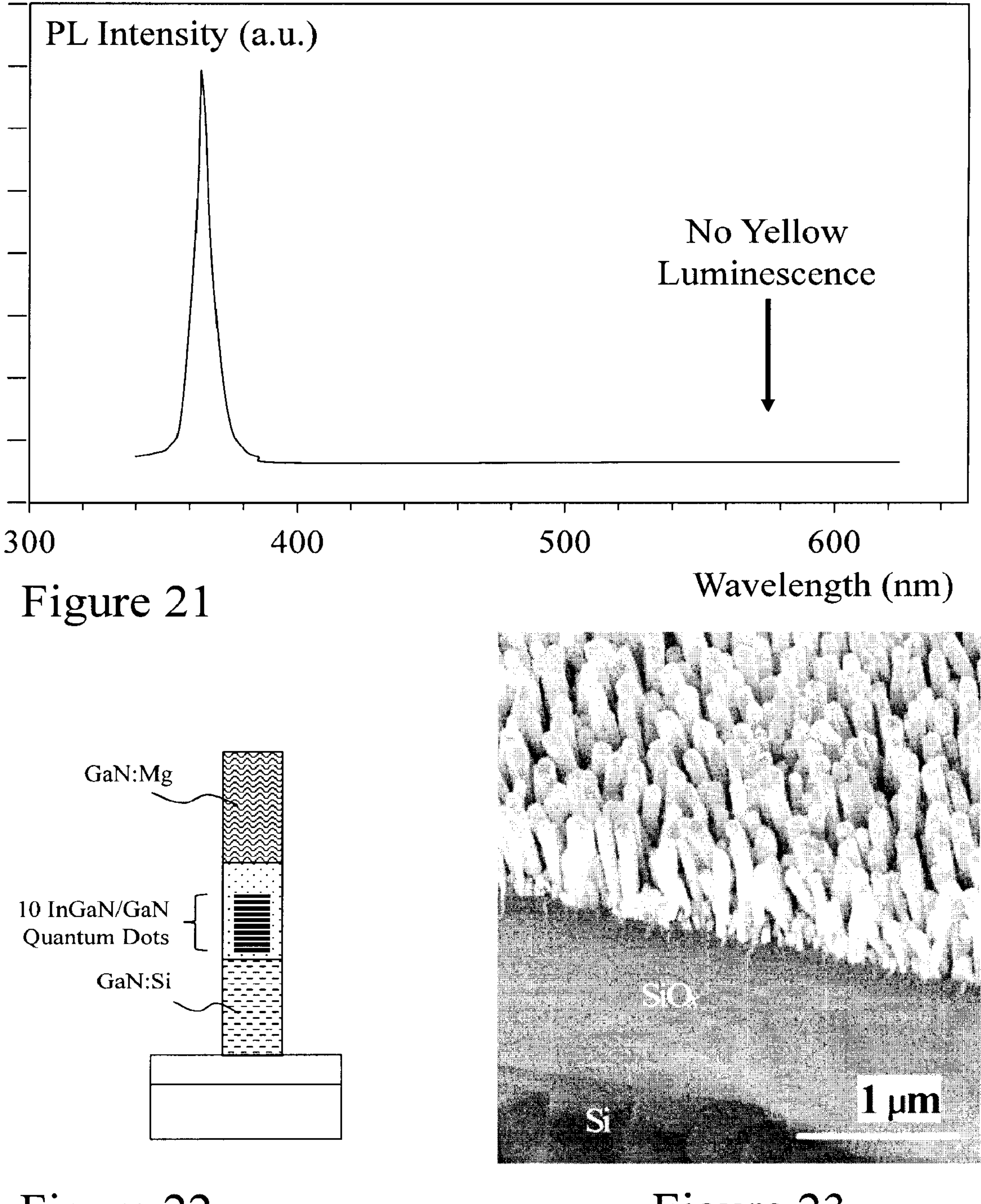
FIG. 21 depicts the photoluminescence spectra at room temperature for GaN nanowires grown on $SiO_x$ templates according to an embodiment of the invention measured with a $\lambda$=405 nm.
FIG. 22 depicts the structure of a InGaN/GaN dot-in-a-wire LED on $SiO_x$ according to an embodiment of the invention.
FIG. 23 depicts a 45° tilted SEM image of InGaN/GaN dot-in-a-wire LEDs grown on a $SiO_x$ template according to an embodiment of the invention.

The PL spectrum measured at room temperature is shown in FIG. 21 and it can be seen that no defect-related yellow luminescence peak/feature is observed. The peak at 363 nm with a linewidth of ≈6 nm can be ascribed to the band-to-band carrier recombination, which is consistent with the band gap energy of GaN. Accordingly, it would be evident to one of skill in the art that the inventors have been able to grow high-quality, both structurally and optically, vertically aligned GaN nanowires on an amorphous template in a large scale offering a route to cost reduction as well as opening other applications where flexible amorphous substrates for example are appropriate rather than single crystalline silicon wafers. It is also evident that the quality of these GaN nanowires on a $SiO_x$ template is comparable to that of GaN nanowires grown directly on Si substrates, see for example Calarco (Nano. Lett., 7, 2248), Debnath et al (Appl. Phys. Lett., 90, 123117), Bertness et al (J. Crystal Growth, 310, pp. 3154-3158), Bertness et al (IEEE. J. Sel. Topics Quant. Electron., 17, 847), and Geelhaar et at (IEEE J. Sel. Topics Quant. Electron., 17, 878), due to the possibly similar growth mechanism, see for example Stoica et at (Small, 4, pp. 751-4) and Consonni et al in (Phys. Rev. B, 83, 035310) Further, the achievement of such highly dense and uniform GaN nanowires on amorphous template is of crucial importance for realizing practical large-area devices, such as LEDs and displays.

Recently, high-efficiency white-color InGaN/GaN nanowire LEDs have been achieved on Si substrates, see for example Nguyen et al (Nano. Lett., 11, pp. 1919-1924). However, the external quantum efficiency has been severely limited by the optical absorption of the Si substrates. Accordingly, improved device performance can be achieved by utilizing amorphous or transparent substrates.

Accordingly, as an example, the inventors have investigated the growth and characterization of the InGaN/GaN dot-in-a-wire LEDs, see Nguyen, on thick an 1.5 μm $SiO_x$ template. A schematic plot of the structure is illustrated in FIG. 22 which is comparable to the prior art schematic in FIG. 1A without the presence of the AlGaN EBL layer. Referring to FIG. 23 there is depicted an SEM image of the as grown InGaN/GaN dot-in-a-wire LEDs. It is evident that the InGaN/GaN dot-in-a-wire LEDs are almost 100% vertically aligned with high uniformity, and the very short nanowires are due to the shadow effect previously described.

The room temperature PL spectrum of the LEDs grown on the ~~1.5 μm $SiO_x$ template are presented together with the PL spectrum from the same structure but grown directly on crystalline Si (111) substrates. The SiO. template LEDs have an emission wavelength of ≈650 nm. It can be seen that the $SiO_x$ template LEDs have comparable or even stronger PL emission intensity compared with that from those on Si(111) substrates which may, potentially, be ascribed to the reduced optical absorption by the $SiO_x$ template.

Figures 24, 25:
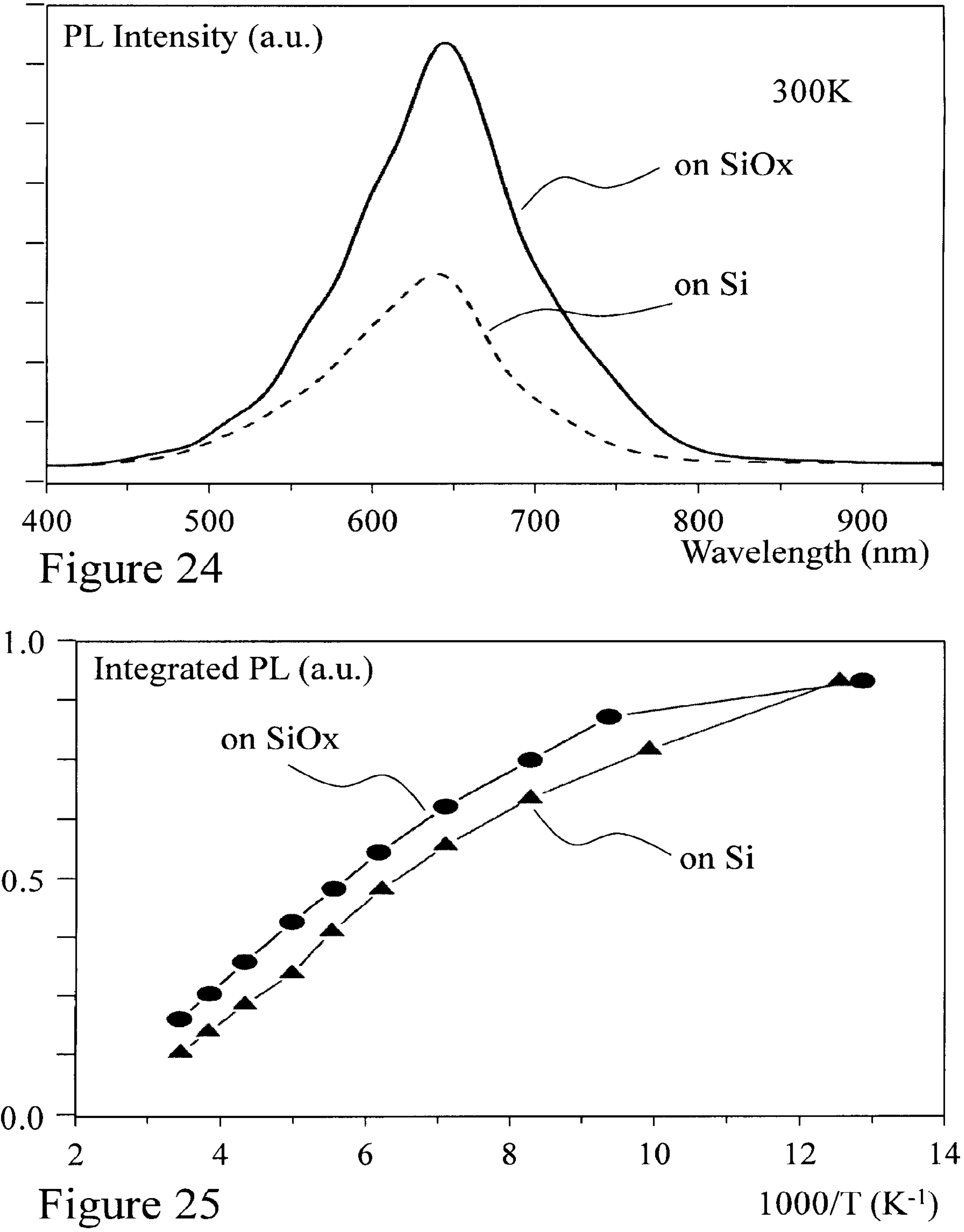
FIG. 24 depicts photoluminescence spectra for InGaN/GaN dot-in-a-wire LEDs grown on a $SiO_x$ template according to an embodiment of the invention and nGaN/GaN dot-in-a-wire LEDs grown on Si substrate.
FIG. 25 depicts normalized integrated photoluminescence intensities as a function of inverse temperature for InGaN/GaN dot-in-a-wire LEDs grown on a $SiO_x$ template according to an embodiment of the invention and nGaN/GaN dot-in-a-wire LEDs grown on Si substrate.

To reveal more details of the $SiO_x$ and Si(l 11) templated InGaN/GaN dot-in-a-wire LEDs the inverse-temperature dependent integrated PL intensity was measured and is depicted in FIG. 25 for 74K≤T≤300K. The integrated PL intensities at T=300K are about 20% and 15%10 of those measured at T=74K for the $SiO_x$ and Si(l 11) templated InGaN/GaN dot-in-a-wire LEDs respectively. These measurements suggest that the optical performance of $SiO_x$ and Si(111) templated InGaN/GaN dot-in-a-wire LEDs on $SiO_x$ is comparable to, or better than that from the same structure but grown directly on crystalline Si(111) substrates. These results are also comparable with the prior art high-performance red-color emitting InGaN/GaN nanowire LEDs on Si substrates, see for example Nguyen et al (IEEE Pto Tech. Lett., 24, 321).

Whilst the embodiments presented supra have been presented in respect of GaN dot-core nanowires it would be evident to one skilled in the art that the principle applies to other group IIIA-nitrides where the group IIIA material nucleates and forms a liquid droplet upon the substrate during the initial phase of the nanowires growth where the nitrogen has not been admitted into the reaction chamber. These group IIIA elements all form a wurtzite crystalline structure in their nitrides. Accordingly the invention may be applied to structures formed with InN or BN deposited onto the substrate as well as GaN deposited onto the substrate. It would also be apparent to one skilled in the art that alternate approaches to patterning the nanowires are feasible without departing from the scope of the invention. It would be apparent that with patterned nanowires with increased spacings and regular patterning the shell deposition process may change such that the ratio of material on the nanowire sidewall to nanowire top adjusts.

It would also be evident that by varying the dimensions of the droplets at the nanoscale the dimensions of the resulting nanowires varies. Further, the inventors have shown that through such growth process not only can high quality nanowires comprising quantum structures such as quantum dots and quantum wells be grown but also that quantum dot within quantum dot structures and quantum dots comprising nanoclusters characterized by a group IIIA element composition higher than that of the surrounding quantum dot may be formed. Semiconductors according to embodiments of the invention may formed from group III and IIIA elements including, but not limited to, boron, aluminum, gallium and indium in combination with group V and VA elements including, but not limited to, nitrogen, phosphorous, and arsenic. Said semiconductors may be binary, ternary, and quaternary and intrinsic or extrinsic with varying doping levels. Within the embodiments of the invention described above the semiconductor material employed for the shell, AlGaN, is a ternary based upon a common group III (Ga) and group V (N) as that of the nanowire. Within other embodiments of the invention the shell may be a member of a different semiconductor family exploiting a different group III and/or group V element to that of the core nanowire. Equally, nothing within the descriptions above shall be taken to imply that a ternary shell (e.g. AlGaN) should be employed in conjunction with a binary nanowire (e.g. GaN with doping for p-type and n-type regions) with ternary quantum structures (e.g. InGaN).

Accordingly, binary, ternary and quaternary shells may be employed with binary nanowires and their quantum structures according to the performance requirements of the optical source which may include environmental factors, such as operating temperature for example, and well as light source characteristics, such as maximum current, operating voltage, operating wavelength, optical bandwidth, etc. Whilst the descriptions have been described in respect of optical sources nothing shall be taken to construe the invention and its embodiments as being limited only to solid state light sources. Core-shell dot-in-a-wire nanowires and core-shell nanowires may be also employed, including but not limited to, optical receivers, solar cells, chemical sensors, and biological sensors where enhancements in electrical injection/extraction and transport may be achieved through the increased confinement of the core-shell structure.

Specific details are given in the above description to provide a thorough understanding of the embodiments. However, it is understood that the embodiments may be practiced without these specific details. For example, circuits may be shown in block diagrams in order not to obscure the embodiments in unnecessary detail in other instances, well-known circuits, processes, algorithms, structures, and techniques may be shown without unnecessary detail in order to avoid obscuring the embodiments.

The foregoing disclosure of the exemplary embodiments of the present invention has been presented for purposes of illustration and description. It is not intended to be exhaustive or to limit the invention to the precise forms disclosed Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A device, comprising:

a substrate;

a plurality of nanowires coupled to the substrate, wherein each nanowire of the plurality of nanowires comprises:

a lower nanowire portion comprising a first n-type semiconductor including a group III element, wherein a face of a first surface of the lower nanowire portion is disposed on the substrate;

a central nanowire portion comprising a plurality of quantum structures, wherein the central nanowire portion is disposed on a face of a second surface of the lower nanowire portion opposite the face of the first surface of the lower nanowire portion; and an upper nanowire portion, disposed on the central nanowire portion opposite the lower nanowire portion, comprising a first p-type semiconductor including the group III element; and a respective outer nanowire shell coupled to a periphery of said each nanowire and encompassing respective peripheries of the lower nanowire portion, the central nanowire portion, and the upper nanowire portion, wherein each said respective outer nanowire shell has a thickness that increases with increasing distance from the substrate.

2. The device of claim 1, wherein a first nanowire of the plurality of nanowires is separated from a second nanowire of the plurality of nanowires by the respective outer nanowire shell of the first nanowire and the respective outer nanowire shell of the second nanowire.

3. The device of claim 1, wherein each said respective outer nanowire shell comprises a semiconductor that has a bandgap that is larger than a bandgap of the plurality of quantum structures of the central nanowire portion.

4. The device of claim 1, wherein the plurality of quantum structures comprises a quantum structure selected from a group consisting of: a quantum dot; a quantum well; and a quantum dot within a quantum dot.

5. The device of claim 1, wherein the lower nanowire portion and the upper nanowire portion of said each nanowire comprise wurtzite semiconductors.

6. The device of claim 1, wherein the quantum structures comprise p-type quantum structures.

7. The device of claim 1, wherein the lower nanowire portion and the upper nanowire portion of said each nanowire comprise binary semiconductors, and wherein each said respective outer nanowire shell comprises a ternary semiconductor.

8. The device of claim 1, further comprising an electron blocking layer incorporated in the central nanowire portion of said each nanowire.

9. The device of claim 1, further comprising an electrical conductor in contact with the upper nanowire portion of said each nanowire.

10. The device of claim 1, further comprising a layer of polyimide adjacent to each said respective outer nanowire shell, wherein the layer of polyimide extends from the substrate to the upper nanowire portion of said each nanowire.

11. The device of claim 1, wherein the respective outer nanowire shell of said each nanowire is in contact with the substrate and extends along an entire length of said each nanowire.

12. The device of claim 8, wherein the electron blocking layer comprises aluminum gallium nitride.

13. A device, comprising:

a nanowire disposed on a substrate, wherein the nanowire comprises a plurality of regions including a p-doped region, an active region, an n-doped region and a shell region;

wherein the active region is disposed between the p-doped region and the n-doped region along a longitudinal axis and in a cross section of the nanowire, wherein the p-doped region is disposed along a first lengthwise portion of the nanowire, the first lengthwise portion being distal to the substrate and the n-doped region is disposed along a second lengthwise portion of the nanowire the second lengthwise portion being adjacent to the substrate, opposite the first lengthwise portion, and wherein the active region includes a plurality of quantum structures such that the quantum structures are embedded in the active region; and wherein the shell region surrounds a periphery of each of the p-doped region, the active region and the n-doped region, and the shell region has a thickness that continuously increases along the entire periphery of the n-doped region, the active region and the p-doped region in a vertical direction with increasing distance from the substrate.

14. The device of claim 13, wherein the shell region comprises a semiconductor that has a bandgap that is larger than a bandgap of a semiconductor of one or more of the p-doped region, the active region and the n-doped region.

15. The device of claim 13, wherein the active region comprises a quantum structure selected from a group consisting of a quantum dot; a quantum well; and a quantum dot within a quantum dot.

16. The device of claim 13, wherein the active region comprises a p-doped semiconductor.

17. The device of claim 13, wherein the p-doped region and the n-doped region comprise binary semiconductors, and wherein the shell region comprises a ternary semiconductor.

18. The device of claim 13, further comprising an electron blocking layer in the active region.

19. The device of claim 13, further comprising:

an electrical conductor in contact with a first end of the nanowire; and a substrate in contact with a second end of the nanowire.

20. The device of claim 13, further comprising a layer of polyimide adjacent to the shell region.

21. The device of claim 13, wherein the nanowire comprises a wurtzite semiconductor.

22. The device of claim 13, wherein the p-doped region, the active region, and the n-doped region comprise gallium nitride, and the shell region comprises aluminum gallium nitride.

23. The device of claim 13, wherein the active region comprises an intrinsic semiconductor.

* * * * *